United States Patent
Park et al.

(10) Patent No.: US 10,255,855 B2
(45) Date of Patent: Apr. 9, 2019

(54) PIXEL OF AN ORGANIC LIGHT EMITTING DIODE DISPLAY DEVICE AND ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Kyong-Tae Park, Suwon-si (KR); Kyu-Sik Cho, Suwon-si (KR); Jin-A Lee, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 161 days.

(21) Appl. No.: 15/158,515

(22) Filed: May 18, 2016

(65) Prior Publication Data

US 2017/0124954 A1 May 4, 2017

(30) Foreign Application Priority Data

Oct. 28, 2015 (KR) .......................... 10-2015-0150483

(51) Int. Cl.
  *G09G 3/3258* (2016.01)
  *H01L 27/32* (2006.01)
  *G09G 3/3233* (2016.01)

(52) U.S. Cl.
  CPC ......... *G09G 3/3258* (2013.01); *G09G 3/3233* (2013.01); *H01L 27/3244* (2013.01); *G09G 2300/0819* (2013.01); *G09G 2300/0852* (2013.01); *G09G 2300/0861* (2013.01); *G09G 2300/0866* (2013.01); *G09G 2310/08* (2013.01);

(Continued)

(58) Field of Classification Search
  CPC .. G09G 3/3258; G09G 3/3233; G09G 3/3291; H01L 27/3244
  See application file for complete search history.

(56) References Cited

U.S. PATENT DOCUMENTS

| 9,450,040 B2 * | 9/2016 | Kim .................... H01L 27/3297 |
| 2009/0140270 A1 * | 6/2009 | Takahashi ............ G09G 3/3233 257/88 |

(Continued)

FOREIGN PATENT DOCUMENTS

| KR | 10-1073281 B1 | 10/2011 |
| KR | 10-1082234 B1 | 11/2011 |

(Continued)

*Primary Examiner* — Sardis F Azongha
(74) *Attorney, Agent, or Firm* — Lewis Roca Rothgerber Christie LLP

(57) ABSTRACT

A pixel of an organic light emitting diode display device includes a scan transistor configured to connect a data line to a first node in response to a scan signal, a storage capacitor connected between the first node and a first power supply voltage, a compensation capacitor connected between the first node and a second node, a driving transistor having a gate connected to the second node, a source connected to the first power supply voltage, and a drain connected to a third node, a compensation transistor configured to connect the second node to the third node in response to a compensation control signal, an organic light emitting diode connected between the third node and a second power supply voltage, and an initialization transistor configured to transfer an initialization voltage in response to an initialization control signal.

6 Claims, 27 Drawing Sheets

(52) U.S. Cl.
CPC ... *G09G 2320/045* (2013.01); *G09G 2330/00* (2013.01)

(56) References Cited

U.S. PATENT DOCUMENTS

| | | | |
|---|---|---|---|
| 2011/0279484 A1* | 11/2011 | Han | G09G 3/3233 345/690 |
| 2012/0007848 A1 | 1/2012 | Han et al. | |
| 2015/0154941 A1* | 6/2015 | Kanda | G09G 5/18 345/213 |

FOREIGN PATENT DOCUMENTS

| | | |
|---|---|---|
| KR | 10-2011-0131959 A | 12/2011 |
| KR | 10-2012-0014718 A | 2/2012 |
| KR | 10-2013-0141153 A | 12/2013 |

\* cited by examiner

PIXEL OF AN ORGANIC LIGHT EMITTING DIODE DISPLAY DEVICE AND ORGANIC LIGHT EMITTING DIODE DISPLAY DEVICE

CROSS-REFERENCE TO RELATED APPLICATION

This application claims priority to and the benefit of Korean Patent Application No. 10-2015-0150483, filed on Oct. 28, 2015 in the Korean Intellectual Property Office (KIPO), the content of which is incorporated herein in its entirety by reference.

BACKGROUND

1. Field

Example embodiments relate to pixels of organic light emitting diode (OLED) display devices and the OLED display devices.

2. Description of the Related Art

In an organic light emitting diode (OLED) display device, a driving transistor included in each pixel generates a driving current based on a data voltage applied to the pixel, and an OLED included in the pixel emits light, based on the driving current, to display an image.

The driving transistor may have a hysteresis characteristic such that a characteristic curve of the driving transistor in a current frame is changed according to an operating state of the driving transistor in a previous frame. Thus, even when the driving transistor receives data voltages having the same voltage level, the driving transistor may generate driving currents having different current levels according to the operating state in the previous frame. Accordingly, in the OLED display device, even when the same data voltage is applied, in a current frame, to a pixel that represented a black color in a previous frame and a pixel that represented a white color in the previous frame, the pixels may have different luminances in the current frame. To prevent or reduce this luminance disuniformity caused by the hysteresis of the driving transistor in a typical OLED display device, respective driving transistors may be initialized to an on-bias state before pixels emit light. Thus, all of the driving transistors in the OLED display device may have substantially the same characteristic curve, thereby reducing the luminance disuniformity caused by the hysteresis. However, in this case, because the driving transistors are turned on in each and every frame, degradation of the driving transistors may be accelerated.

Further, respective driving transistors included in an OLED display device may have different threshold voltages due to a process variation, etc. Thus, to reduce threshold voltage variations among the respective driving transistors in the OLED display device, a threshold voltage compensation voltage corresponding to a threshold voltage of a driving transistor may be stored in each pixel, and a data voltage to which the threshold voltage compensation voltage is added may be applied to a gate of the driving transistor. However, in a typical OLED display device, when a threshold voltage compensation operation is initiated, an initial voltage level of the threshold voltage compensation voltage provided to the compensation capacitor may be changed due to charge sharing between the compensation capacitor and a parasitic capacitor of an OLED, and thus a final voltage level of the threshold voltage compensation voltage stored in the compensation capacitor may be different from a desired voltage level. This unwanted threshold voltage compensation voltage change may be worsened by a characteristic change of the parasitic capacitor of the OLED caused by degradation of the OLED. Further, this unwanted voltage change may further be worsened when an anode of the OLED is sufficiently initialized.

SUMMARY

Some example embodiments provide a pixel of an organic light emitting diode display device capable of reducing a stress applied to a driving transistor, accurately compensating a threshold voltage of the driving transistor, and maintaining a voltage of an anode of an organic light emitting diode to be substantially constant until the organic light emitting diode emits light.

Some example embodiments provide an organic light emitting diode display device capable of reducing a stress applied to a driving transistor, accurately compensating a threshold voltage of the driving transistor, and maintaining a voltage of an anode of an organic light emitting diode to be substantially constant until the organic light emitting diode emits light.

According to some example embodiments, there is provided a pixel of an organic light emitting diode display device including a scan transistor configured to connect a data line to a first node in response to a scan signal, a storage capacitor connected between the first node and a first power supply voltage, a compensation capacitor connected between the first node and a second node, a driving transistor having a gate connected to the second node, a source connected to the first power supply voltage, and a drain connected to a third node, a compensation transistor configured to connect the second node to the third node in response to a compensation control signal, an organic light emitting diode connected between the third node and a second power supply voltage, and an initialization transistor configured to transfer an initialization voltage in response to an initialization control signal, the compensation transistor and the initialization transistor being turned on in response to the compensation control signal and the initialization control signal to transfer the initialization voltage to the second node and the third node during an initialization period.

In some example embodiments, when the initialization voltage is transferred to the second node and the third node, by the compensation transistor and the initialization transistor, during the initialization period, the driving transistor may be initialized to an off-bias state.

In some example embodiments, the initialization voltage may be the first power supply voltage.

In some example embodiments, the compensation transistor may include at least two transistors connected in series between the second node and the third node, and the initialization transistor may have a gate to which the initialization control signal is applied, a first terminal connected to the first power supply voltage, and a second terminal connected to a node between the at least two transistors.

In some example embodiments, wherein the initialization transistor may have a gate to which the initialization control signal is applied, a first terminal connected to the first power supply voltage, and a second terminal connected to the third node.

In some example embodiments, during a data writing period in which a data voltage is written to the storage capacitor, the initialization transistor may be turned on in response to the initialization control signal to reinitialize the third node to the first power supply voltage.

In some example embodiments, the initialization transistor may have a gate to which the initialization control signal is applied, a first terminal connected to the first power supply voltage, and a second terminal connected to the second node.

In some example embodiments, the initialization transistor may include at least two transistors connected in series between the first power supply voltage and the second node.

In some example embodiments, the initialization voltage may be the second power supply voltage.

In some example embodiments, the initialization transistor may have a gate to which the initialization control signal is applied, a first terminal connected to the second power supply voltage, and a second terminal connected to the second node.

In some example embodiments, the initialization transistor may have a gate to which the initialization control signal is applied, a first terminal connected to the second power supply voltage, and a second terminal connected to the third node.

In some example embodiments, the initialization voltage may be different from the first and second power supply voltages, and the initialization voltage may be applied through an initialization voltage line.

In some example embodiments, the initialization transistor may have a gate to which the initialization control signal is applied, a first terminal connected to the initialization voltage line, and a second terminal connected to the second node.

In some example embodiments, the initialization transistor may have a gate to which the initialization control signal is applied, a first terminal connected to the initialization voltage line, and a second terminal connected to the third node.

In some example embodiments, the initialization voltage may be applied through the data line.

In some example embodiments, the initialization transistor may have a gate to which the initialization control signal is applied, a first terminal connected to the data line, and a second terminal connected to the third node.

In some example embodiments, the initialization voltage may be applied through a sensing line, and the initialization transistor may be a sensing transistor connected between the third node and the sensing line.

In some example embodiments, the pixel may further include an emission control transistor configured to selectively connect the third node to the organic light emitting diode in response to an emission control signal.

According to some example embodiments, there is provided a pixel of an organic light emitting diode display device including first and second transistors connected in series between a data line and a first node, the first and second transistors being turned on in response to a scan signal, a first capacitor connected between the first node and a first power supply voltage, a second capacitor connected between the first node and a second node, a third transistor having a gate connected to the second node, a first terminal connected to the first power supply voltage, and a second connected to a third node, fourth and fifth transistors connected in series between the second node and the third node, the fourth and fifth transistors being turned on in response to a compensation control signal, a sixth transistor having a gate to which an initialization control signal is applied, a first terminal connected to the first power supply voltage, and a second terminal connected to a fourth node between the fourth and fifth transistors, and an organic light emitting diode connected between the third node and a second power supply voltage.

According to some example embodiments, there is provided an organic light emitting diode display device including a plurality of pixels, each of the pixels including a scan transistor configured to connect a data line to a first node in response to a scan signal, a storage capacitor connected between the first node and a first power supply voltage, a compensation capacitor connected between the first node and a second node, a driving transistor having a gate connected to the second node, a source connected to the first power supply voltage, and a drain connected to a third node, a compensation transistor configured to connect the second node to the third node in response to a compensation control signal, an organic light emitting diode connected between the third node and a second power supply voltage, and an initialization transistor configured to transfer an initialization voltage in response to an initialization control signal, the compensation transistor and the initialization transistor being turned on in response to the compensation control signal and the initialization control signal, respectively, to transfer the initialization voltage to the second node and the third node during an initialization period.

As described above, in the pixel of the organic light emitting diode display device and in the organic light emitting diode display device according to example embodiments, because the driving transistor is initialized to the off-bias state, the stress applied to the driving transistor may be reduced.

In addition, in the pixel of the organic light emitting diode display device and in the organic light emitting diode display device according to example embodiments, a voltage of a gate of the driving transistor may be initialized to a substantially fixed voltage before a threshold voltage compensation operation for the driving transistor is initiated, and thus an initial voltage level of the threshold voltage compensation voltage provided to the compensation capacitor may not be undesirably changed over time. Accordingly, the threshold voltage of the driving transistor may be accurately compensated even after the lapse of time.

Further, in the pixel of the organic light emitting diode display device and in the organic light emitting diode display device according to example embodiments, a voltage of an anode of the organic light emitting diode may be maintained to be substantially constant and to be substantially uniform with respect to all of the pixels until the organic light emitting diode emits light, and thus luminance uniformity of the organic light emitting diode display device may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
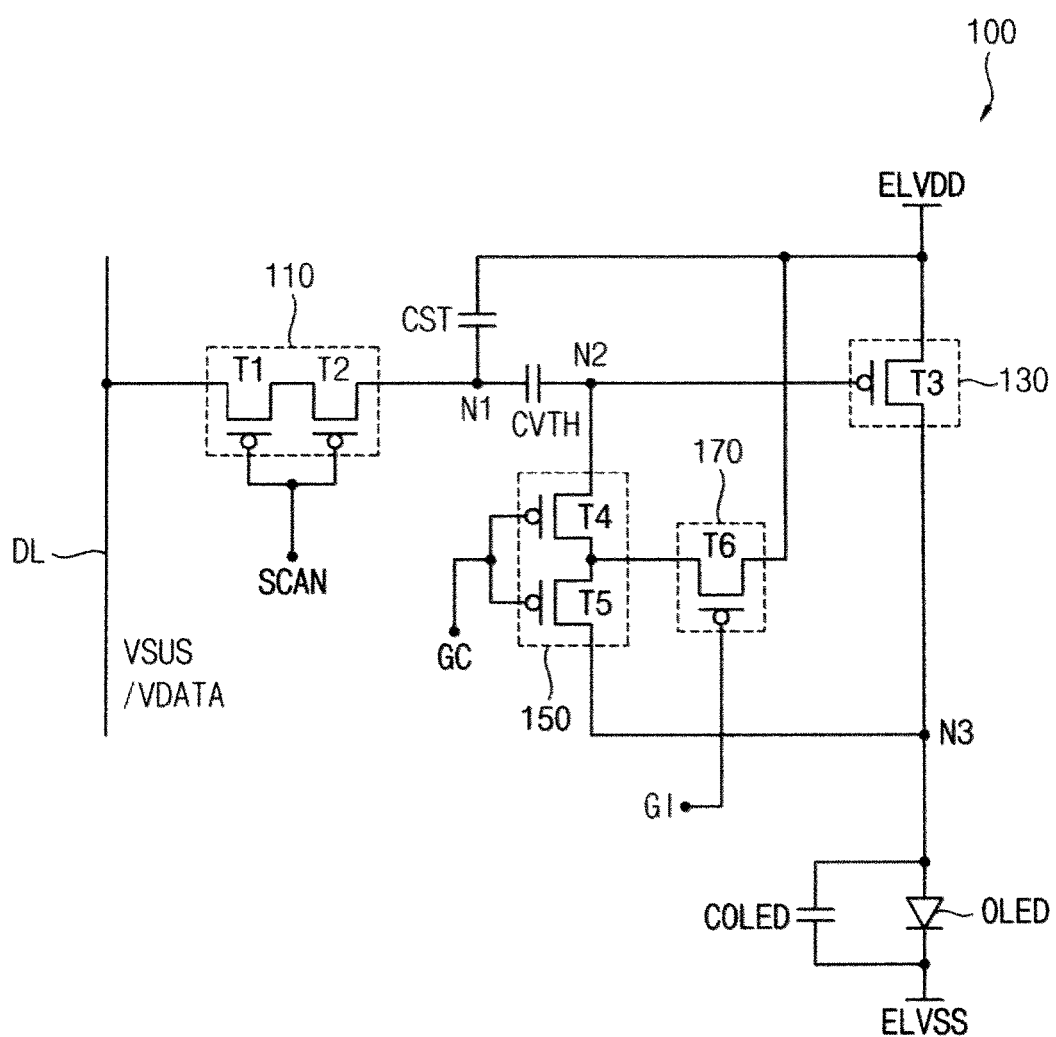
FIG. 1 is a circuit diagram illustrating a pixel of an organic light emitting diode display device according to example embodiments.

The example embodiments are described more fully hereinafter with reference to the accompanying drawings. Like or similar reference numerals refer to like or similar elements throughout.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Figure 2:
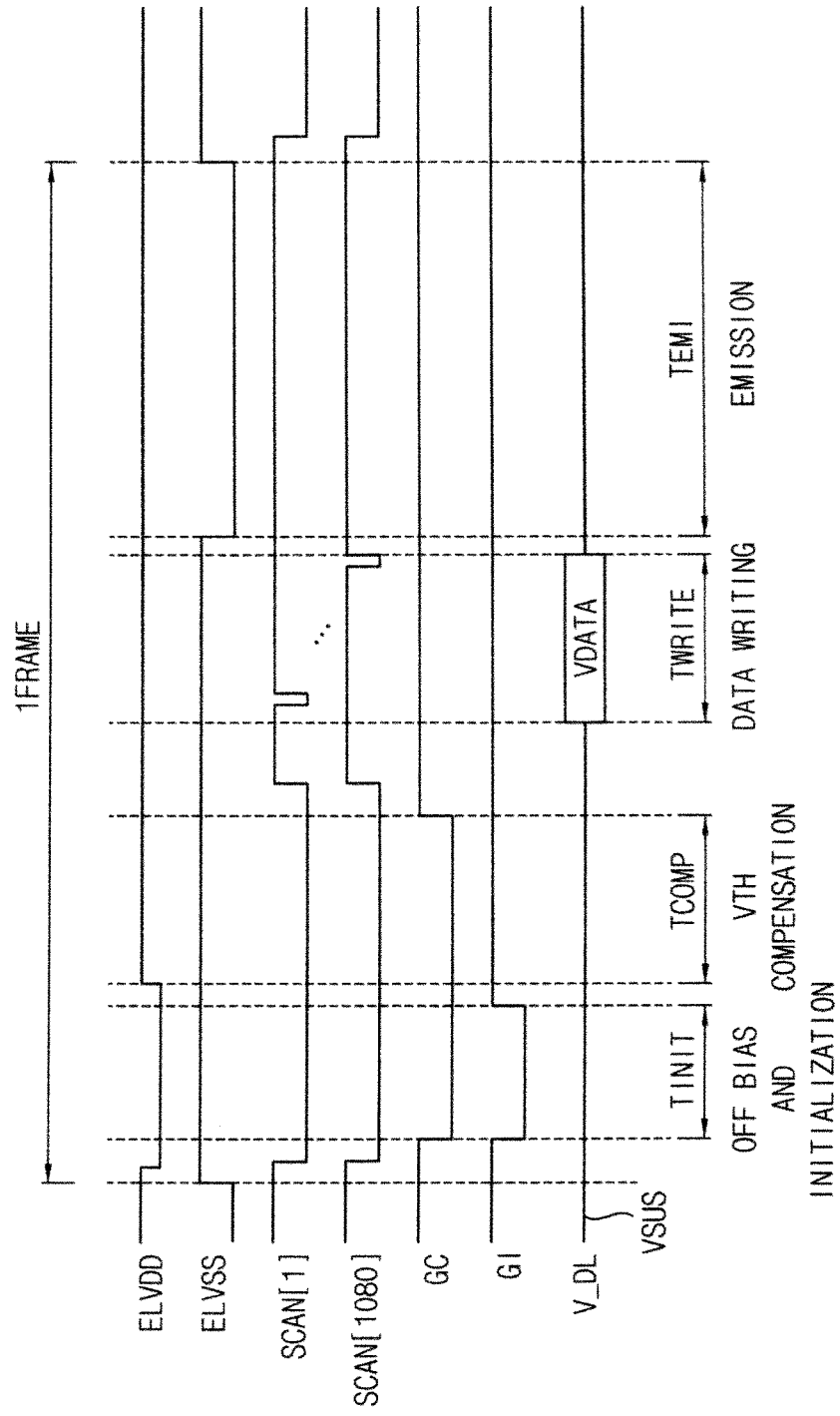
FIG. 2 is a timing diagram for illustrating an operation of a pixel of an organic light emitting diode display device illustrated in FIG. 1.

FIG. 1 is a circuit diagram illustrating a pixel of an organic light emitting diode display device according to example embodiments, and FIG. 2 is a timing diagram for illustrating an operation of a pixel of an organic light emitting diode display device illustrated in FIG. 1.

Referring to FIG. 1, a pixel 100 of an organic light emitting diode display device may include a scan transistor 110, a storage capacitor CST, a compensation capacitor CVTH, a driving transistor 130, a compensation transistor 150, an organic light emitting diode OLED, and an initialization transistor 170.

The scan transistor 110 may connect a data line DL to a first node N1 in response to a scan signal SCAN. The scan transistor 110 may have a gate to which the scan signal SCAN is applied, a first terminal connected to the data line DL, and a second terminal connected to the first node N1. In some example embodiments, the scan transistor 110 may have a dual gate structure including two transistors T1 and T2 connected in series between the data line DL and the first node N1. In a case in which the scan transistor 110 has the dual gate structure, a leakage current through the scan transistor 110 may be reduced. For example, in the scan transistor 110, two gates of the two transistors T1 and T2 connected in series may be connected to each other through a line, and a highly doped region having a high conductivity may be provided as a common gate region. In other example embodiments, the scan transistor 110 may be implemented with a single transistor, or may include three or more transistors.

The storage capacitor CST may be connected between the first node N1 and a first power supply voltage ELVDD. The storage capacitor CST may store a voltage (e.g., a sustain voltage VSUS or a data voltage VDATA) transferred from the data line DL by the scan transistor 110.

The compensation capacitor CVTH may be connected between the first node N1 and a second node N2. In a threshold voltage compensation period, the compensation capacitor CVTH may store a threshold voltage compensation voltage (e.g., a voltage difference between the first power supply voltage ELVDD from which an absolute value of a threshold voltage of the driving transistor 130 is subtracted and the sustain voltage VSUS) corresponding to the threshold voltage of the driving transistor 130.

The driving transistor 130 may generate a driving current based on the data voltage VDATA stored in the storage capacitor CST and the threshold voltage compensation voltage stored in the compensation capacitor CVTH. In some example embodiments, the driving transistor 130 may be implemented with a transistor T3 having a gate connected to the second node N2, a source connected to the first power supply voltage ELVDD, and a drain connected to a third node N3.

The compensation transistor 150 may connect the second node N2 to the third node N3 in response to a compensation control signal GC. The compensation transistor 150 may have a gate to which the compensation control signal GC is applied, a first terminal connected to the second node N2, and a second terminal connected to the third node N3.

In some example embodiments, the compensation transistor 150 may have a dual gate structure including two transistors T4 and T5 connected in series between the second node N2 and the third node N3. In a case in which the compensation transistor 150 has the dual gate structure, a leakage current through the compensation transistor 150 may be reduced. In other example embodiments, the compensation transistor 150 may be implemented with a single transistor, or may include three or more transistors.

In some example embodiments, the compensation control signal GC may be a global control signal that is concurrently (e.g., substantially simultaneously) applied to all of the pixels included in the organic light emitting diode display device.

The organic light emitting diode OLED may be connected between the third node N3 and a second power supply voltage ELVSS. The organic light emitting diode OLED may emit light with desired luminance in response to the driving current generated by the driving transistor 130. The organic light emitting diode OLED may have a parasitic capacitor COLED.

The initialization transistor 170 may transfer an initialization voltage in response to an initialization control signal GI. According to example embodiments, the initialization transistor 170 may transfer the initialization voltage to a node between two transistors T4 and T5 of the compensation transistor 150, to the second node N2, or to the third node N3. According to example embodiments, the initialization voltage transferred by the initialization transistor 170 may be the first power supply voltage ELVDD, the second power supply voltage ELVSS, or a separate dedicated voltage. In some example embodiments, the initialization control signal GI may be a global control signal that is concurrently (e.g., substantially simultaneously) applied to all of the pixels included in the organic light emitting diode display device.

In some example embodiments, as illustrated in FIG. 1, the initialization transistor 170 may be implemented with a transistor T6 having a gate to which the initialization control signal GI is applied, a first terminal connected to the first power supply voltage ELVDD, and a second terminal connected to a node between the two transistors T4 and T5 of the compensation transistor 150. In this case, the initialization transistor 170 may transfer the first power supply voltage ELVDD as the initialization voltage to the node between the two transistors T4 and T5 of the compensation transistor 150 in response to the initialization control signal GI.

During an initialization period, the compensation transistor 150 and the initialization transistor 170 may be turned on in response to the compensation control signal GC and the initialization control signal GI, respectively, and the turned-on compensation and initialization transistors 150 and 170 may transfer the first power supply voltage ELVDD as the initialization voltage to the second node N2 and the third node N3. Accordingly, during the initialization period, a gate-source voltage of the driving transistor 130 may be about 0 V, a drain-source voltage of the driving transistor 130 may also be about 0 V, and thus the driving transistor 130 may be initialized to an off-bias state. Because the driving transistor 130 is initialized, a hysteresis of the driving transistor 130 may be removed, and driving transistors 130 in all of the pixels may have substantially the same response characteristic regardless of operating states of the driving transistors 130 in a previous frame.

In a typical organic light emitting diode display device, driving transistors are initialized to an on-bias state, and thus degradation of the driving transistors may be accelerated because the driving transistors are turned on each and every frame. However, in the organic light emitting diode display device according to example embodiments, because the driving transistors 130 are initialized to the off-bias state, stress applied to the driving transistors 130 may be reduced, and thus the degradation of the driving transistors 130 may be reduced.

Further, during the initialization period before the threshold voltage compensation period, the second node N2 (or a gate node of the driving transistor 130) may be initialized to the first power supply voltage ELVDD. Accordingly, before a threshold voltage compensation operation for the driving transistor 130 is initiated, a voltage of the gate of the driving transistor 130 may be initialized to a substantially fixed voltage (e.g., the first power supply voltage ELVDD in the embodiment illustrated in FIG. 1), and thus an initial voltage level of the threshold voltage compensation voltage provided to the compensation capacitor CVTH (or a voltage level of one electrode of the compensation capacitor CVTH when the threshold voltage compensation operation is initiated) may be substantially constant even after the lapse of time.

In a typical organic light emitting diode display device, when a threshold voltage compensation operation is initiated, an initial voltage level of a threshold voltage compensation voltage provided to a compensation capacitor (or a voltage level of one electrode of the compensation capacitor) may be changed due to charge sharing between the compensation capacitor and a parasitic capacitor of an organic light emitting diode, and thus a final voltage level of the threshold voltage compensation voltage stored in the compensation capacitor may be different from a desired voltage level.

The effects of this unwanted voltage change may be worsened by a characteristic change of the parasitic capacitor of the organic light emitting diode caused by degradation of the organic light emitting diode. However, in the organic light emitting diode display device according to example embodiments, the voltage of the gate of the driving transistor 130 may be fixed to a constant voltage (e.g., the first power supply voltage ELVDD in the embodiment illustrated in FIG. 1), the initial voltage level of the threshold voltage compensation voltage provided to the compensation capacitor CVTH may not be undesirably changed, and thus the final voltage level of the threshold voltage compensation voltage stored in the compensation capacitor CVTH may be the desired voltage level. Accordingly, in the organic light emitting diode display device according to example embodiments, the threshold voltage of the driving transistor 130 may be accurately compensated even after the lapse of time.

Further, during the initialization period, at the same time when the driving transistor 130 is initialized to the off-bias state, the third node N3 (or an anode of the organic light emitting diode OLED) may be initialized (e.g., the parasitic capacitor COLED of the organic light emitting diode OLED may be discharged) to the initialization voltage (e.g., the first power supply voltage ELVDD in the embodiment illustrated in FIG. 1).

Accordingly, because the off-bias of the driving transistor 130 and the anode initialization of the organic light emitting diode OLED are concurrently (e.g., substantially simultaneously) performed, a sufficient time may be assigned for the anode initialization of the organic light emitting diode OLED compared with a typical organic light emitting diode display device where separate times are respectively assigned for the initialization of the driving transistor and the anode initialization of the organic light emitting diode.

In a typical organic light emitting diode display device, as time passes, an anode of an organic light emitting diode may not be initialized to a desired voltage level because of an increase of an absolute value of a threshold voltage of a driving transistor and a decrease of a driving current caused by degradation of the driving transistor, and because of a characteristic change of a parasitic capacitor caused by degradation of the organic light emitting diode. However, in the organic light emitting diode display device according to example embodiments, sufficient time may be assigned for the anode initialization of the organic light emitting diode OLED, the degradation of the driving transistor 130 may be reduced because the driving transistor 130 is initialized to the off-bias state, and thus the anode of the organic light emitting diode OLED may be sufficiently initialized even after the lapse of time.

Hereinafter, an operation of the pixel 100 in the organic light emitting diode display device according to example embodiments in one frame will be described with reference to FIGS. 1 and 2.

Referring to FIGS. 1 and 2, when a frame is started, the second power supply voltage ELVSS may be increased from a first ELVSS voltage level to a second ELVSS voltage level corresponding to a first ELVDD voltage level of the first power supply voltage ELVDD. For example, the first ELVSS voltage level may be about 0 V, and the second ELVSS voltage level may be about 13 V, but the present invention is not limited thereto.

Because the second power supply voltage ELVSS is increased from the first ELVSS voltage level to the second ELVSS voltage level, pixels of the organic light emitting diode display device may not emit light. Further, the first power supply voltage ELVDD may be decreased from the first ELVDD voltage level to a second ELVDD voltage level that is higher than the first ELVSS voltage level and lower than the first ELVDD voltage level. In some example embodiments, the second ELVDD voltage level may be lower than a voltage level of the sustain voltage VSUS applied through the scan transistor 110 from the data line DL. Accordingly, while the first power supply voltage ELVDD has the second ELVDD voltage level, the threshold voltage compensation operation for the driving transistor 130 may not be performed. For example, the first ELVDD voltage level may be about 13 V, the voltage level of the sustain voltage VSUS may be about 11 V, and the second ELVDD voltage level may be about 6 V.

Scan signals SCAN[1] to SCAN[1080] may be concurrently (e.g., simultaneously) applied to all of the scan lines of the organic light emitting diode display device, and thus the scan transistors 110 of all of the pixels may be turned on. The sustain voltage VSUS may be applied as a voltage V_DL of the data line DL, and the sustain voltage VSUS may be transferred by the turned-on scan transistors 110 to the first nodes N1 of the pixels.

During the initialization period TINIT, the driving transistor 130 may be initialized to the off-bias state, and the second node N2 and the third node N3 may be initialized to the initialization voltage (or to the first power supply voltage ELVDD having the second ELVDD voltage level). That is, during the initialization period TINIT, the compensation control signal GC having a low level may be applied to the compensation transistor 150, the initialization control signal GI having a low level may be applied to the initialization transistor 170, and thus the compensation transistor 150 and the initialization transistor 170 may be turned on.

The turned-on initialization transistor 170 may transfer the first power supply voltage ELVDD, having the second ELVDD voltage level, to the node between the two transistors T4 and T5 of the compensation transistor 150, and the two transistors T4 and T5 of the turned-on compensation transistor 150 may transfer the first power supply voltage ELVDD, having the second ELVDD voltage level, to the second node N2 (or the gate node of the driving transistor 130) and the third node (or the anode of the organic light emitting diode OLED).

Accordingly, during the initialization period TINIT, the first power supply voltage ELVDD may be applied to the gate, the source and the drain of the driving transistor 130, and thus the driving transistor 130 may have the gate-source voltage of about 0 V and the drain-source voltage of about 0 V. Therefore, during the initialization period TINIT, the driving transistor 130 may be initialized to the off-bias state when the gate-source voltage of about 0 V and the drain-source voltage of about 0 V are applied. Accordingly, the hysteresis of the driving transistor 130 may be removed while reducing (e.g., minimizing) the stress applied to the driving transistor 130.

Further, during the initialization period TINIT, the first power supply voltage ELVDD, having the second ELVDD voltage level, may be applied to the third node N3 (or the anode of the organic light emitting diode OLED), and thus the anode of the organic light emitting diode OLED may be initialized. For example, the second power supply voltage ELVSS, having the second ELVSS voltage level, may be applied to a cathode of the organic light emitting diode OLED, the first power supply voltage ELVDD, having the second ELVDD voltage level that is lower than the second ELVSS voltage level, may be applied to the anode of the organic light emitting diode OLED, and thus the parasitic capacitor COLED of the organic light emitting diode OLED may be discharged by a reverse voltage applied to the organic light emitting diode OLED.

Because the organic light emitting diode OLED is initialized concurrently (e.g., simultaneously) with the off-bias of the driving transistor 130, a sufficient time may be assigned for the anode initialization, and the anode of the organic light emitting diode OLED may be sufficiently initialized. Further, because the driving transistor 130 is initialized to the off-bias state, the degradation of the driving transistor 130 may be reduced, and thus the anode of the organic light emitting diode OLED may be sufficiently initialized even after the lapse of time.

In addition, during the initialization period TINIT, the first power supply voltage ELVDD, having the second ELVDD voltage level, may be applied to the second node N2 (or the gate node of the driving transistor 130), and the gate node of the driving transistor 130 may be initialized to the fixed or constant second ELVDD voltage level. Thus, when the threshold voltage compensation operation for the driving transistor 130 is initiated, a voltage of the second node N2 (or a gate voltage of the driving transistor 130) may be substantially fixed or constant even after the lapse of time.

The initialization control signal GI having a high level may be applied to the initialization transistor 170, the initialization transistor 170 may be turned off in response to the initialization control signal GI having the high level, and thus the initialization period TINIT may be terminated.

Thereafter, the first power supply voltage ELVDD may be increased from the second ELVDD voltage level to the first ELVDD voltage level, and thus the threshold voltage compensation period TCOMP may be initiated. In the organic light emitting diode display device according to example embodiments, unlike a typical organic light emitting diode display device where a driving transistor is diode-connected by a compensation transistor in response to a compensation control signal having a low level to perform a threshold voltage compensation operation, the driving transistor 130 may be diode-connected by the compensation transistor 150 in the initialization period TINIT before the threshold voltage compensation period TCOMP, the diode-connection of the driving transistor 130 may be maintained during the threshold voltage compensation period TCOMP, and the threshold voltage compensation operation may be initiated in response to the increase of the first power supply voltage ELVDD from the second ELVDD voltage level to the first ELVDD voltage level.

During the threshold voltage compensation period TCOMP, the threshold voltage compensation voltage (e.g., a voltage difference between the first power supply voltage ELVDD from which an absolute value of the threshold voltage of the driving transistor 130 is subtracted and the sustain voltage VSUS) may be stored in the compensation capacitor CVTH. In the organic light emitting diode display device according to example embodiments, because the voltage of the second node N2 (or the voltage of the gate of the driving transistor 130) is initialized to the second ELVDD voltage level during the initialization period TINIT, the initial voltage level of the threshold voltage compensation voltage provided to the compensation capacitor CVTH may be fixed or constant even after the lapse of time.

Accordingly, the threshold voltage compensation voltage may be accurately stored in the compensation capacitor CVTH, and thus the threshold voltage of the driving transistor 130 may be accurately compensated. The compensation control signal GC having a high level may be applied to the compensation transistor 150, the compensation transistor 150 may be turned off in response to the compensation control signal GC having the high level, and thus the threshold voltage compensation period TCOMP may be terminated.

Thereafter, during a data writing period TWRITE, the scan signals SCAN[1] to SCAN[1080] may be sequentially applied to the pixels included in the organic light emitting diode display device on a scan line basis (e.g., a scan line-by-scan line basis), the data voltages VDATA may be applied as voltages V_DL of the data lines DL, and thus the data voltage VDATA may be stored in the storage capacitor CST in each of the pixels.

Subsequently, the second power supply voltage ELVSS may be decreased from the second ELVSS voltage level to the first ELVSS voltage level, and thus an emission period TEMI may be initiated. During the emission period TEMI, the driving transistor 130 may generate a driving current based on a voltage where the data voltage VDATA stored in the storage capacitor CST and the threshold voltage compensation voltage stored in the compensation capacitor CVTH are added, and the organic light emitting diode OLED may emit light based on the driving current generated by the driving transistor 130.

As described above, in the pixel 100 of the organic light emitting diode display device according to example embodiments, the driving transistor 130 may be initialized to the off-bias state during the initialization period TINIT, and thus the stress applied to the driving transistor 130 may be reduced (e.g., minimized). Further, during the initialization period TINIT, because the voltage of the gate of the driving transistor 130 is initialized to the first power supply voltage ELVDD having the second ELVDD voltage level, the initial voltage level of the threshold voltage compensation voltage provided to the compensation capacitor CVTH may be fixed or constant, and thus the threshold voltage of the driving transistor 130 may be accurately compensated. In addition, during the initialization period TINIT, the voltage of the anode of the organic light emitting diode OLED may be sufficiently initialized.

Figure 3:
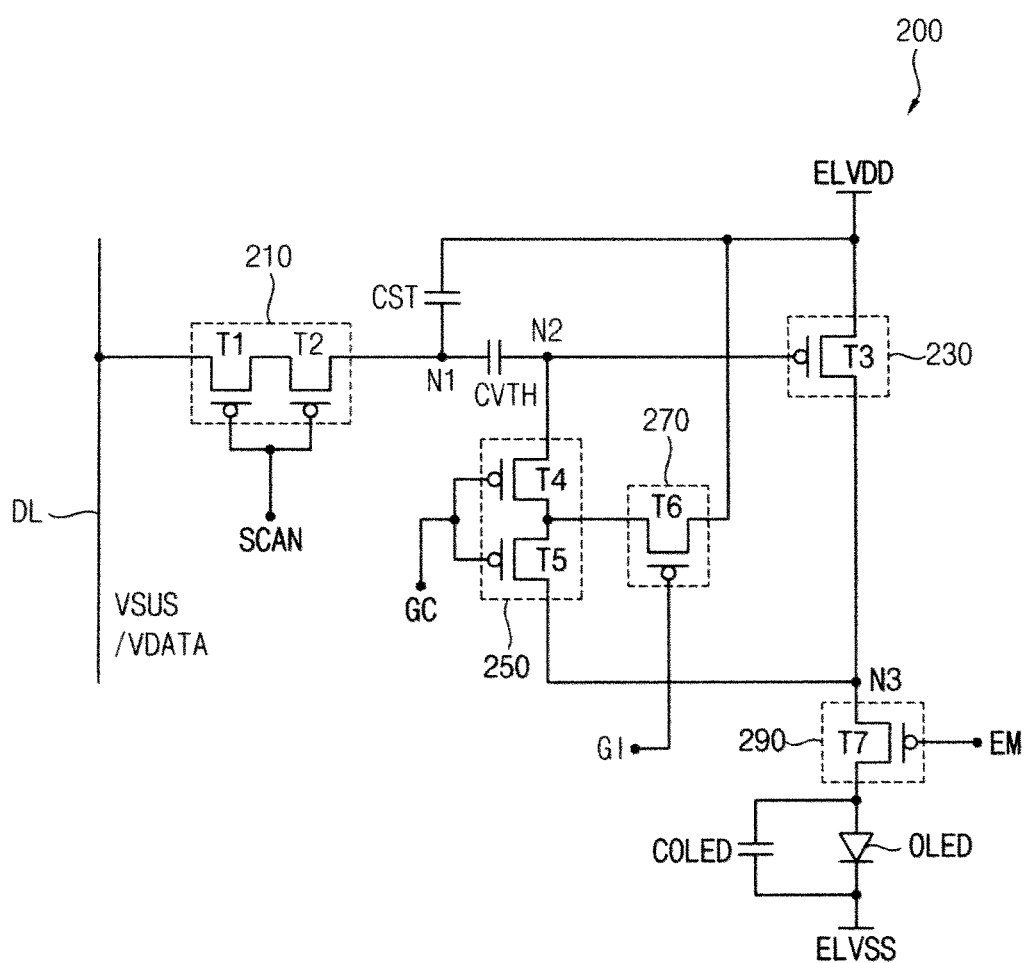
FIG. 3 is a circuit diagram illustrating a pixel of an organic light emitting diode display device according to example embodiments.
Figure 4:
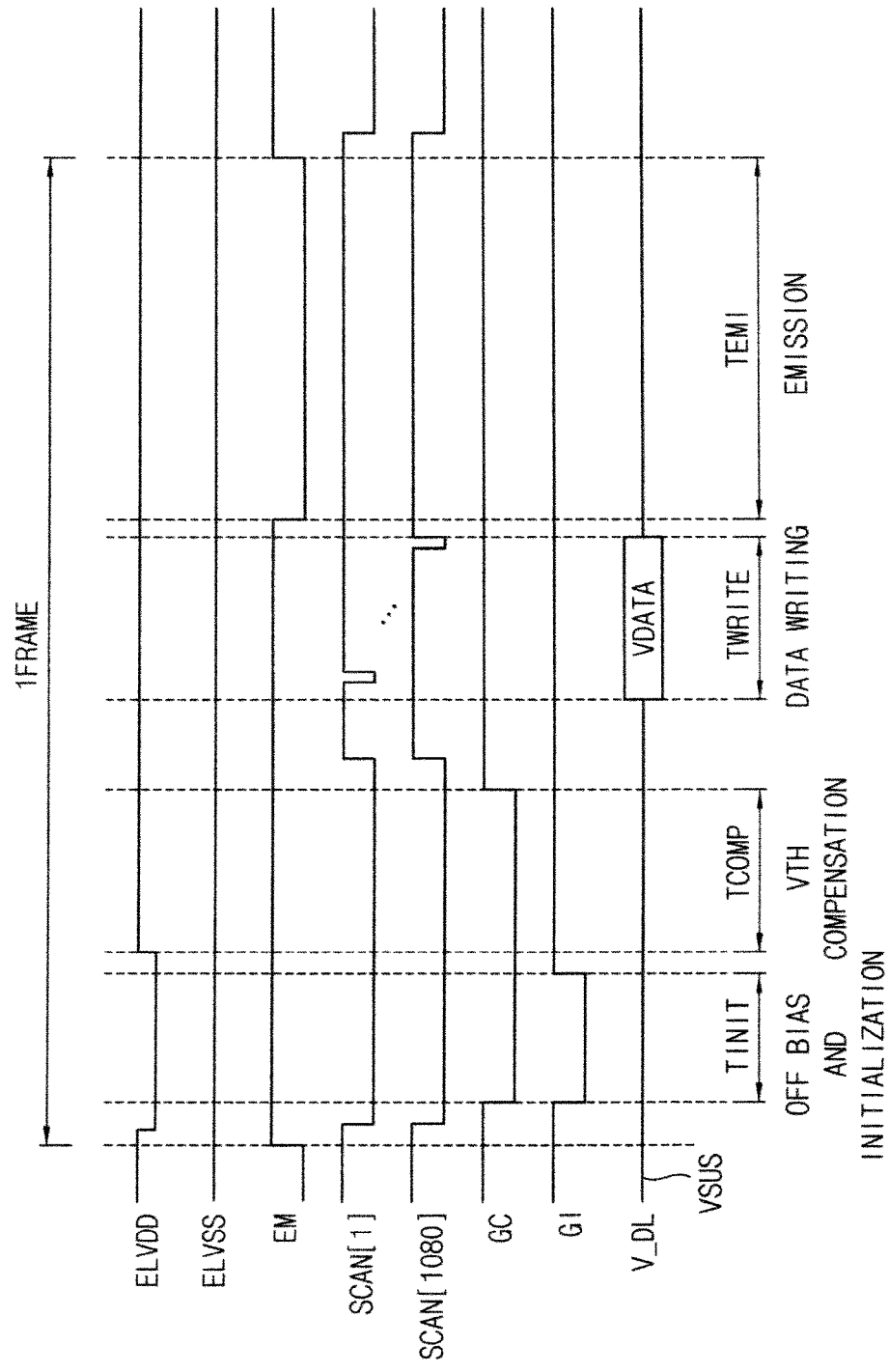
FIG. 4 is a timing diagram for illustrating an operation of a pixel of an organic light emitting diode display device illustrated in FIG. 3.

FIG. 3 is a circuit diagram illustrating a pixel of an organic light emitting diode display device according to example embodiments, and FIG. 4 is a timing diagram for illustrating an operation of a pixel of an organic light emitting diode display device illustrated in FIG. 3.

Referring to FIG. 3, a pixel 200 of an organic light emitting diode display device may include a scan transistor 210, a storage capacitor CST, a compensation transistor CVTH, a driving transistor 230, a compensation transistor 250, an organic light emitting diode OLED, an initialization transistor 270, and an emission control transistor 290. Compared with the pixel 100 of FIG. 1, the pixel 200 of FIG. 3 may additionally include the emission control transistor 290. Hereinafter, descriptions of elements, components, or features that are substantially the same as elements, components, or features of previously discussed embodiments or figures may be omitted for clarity of the distinctions between the presented embodiments of the present invention.

The emission control transistor 290 may selectively connect a third node N3 to the organic light emitting diode OLED in response to an emission control signal EM. In some example embodiments, the emission control transistor 290 may be implemented with a transistor T7 having a gate to which the emission control signal EM is applied, a first terminal connected to the third node N3, and a second terminal connected to the anode of the organic light emitting diode OLED.

Referring to FIGS. 3 and 4, when a frame is started, the emission control signal EM having a high level may be applied to the emission control transistor 290, and the emission control transistor 290 may be turned off in response to the emission control signal EM having the high level. Because the emission control transistor 290 is turned off, a current path from a first power supply voltage ELVDD to a second power supply voltage ELVSS may not be formed, and thus the pixel 200 may not emit light.

In an example embodiment illustrated in FIG. 4, unlike an example embodiment illustrated in FIG. 2, the second power supply voltage ELVSS may be constant at a first ELVSS voltage level (e.g., about 0V). An operation of the pixel 200 according to the timing diagram of FIG. 4 may be similar to an operation of the pixel 100 according to the timing diagram of FIG. 2, except that the second power supply voltage ELVSS may not change, and the emission control transistor 290 may control a connection between the third node N3 and an anode of the organic light emitting diode OLED in response to the emission control signal EM.

As illustrated in FIG. 4, during a threshold voltage compensation period TCOMP in which a threshold voltage of the driving transistor 230 is compensated, a third node N3 (or a drain of the driving transistor 230) may be disconnected from the anode of the organic light emitting diode OLED by the emission control transistor 290, and thus a parasitic capacitor COLED of the organic light emitting diode OLED may not affect a threshold voltage compensation operation for the driving transistor 230. During an initialization period TINIT, an initialization voltage may not be applied to the anode of the organic light emitting diode OLED and the parasitic capacitor COLED of the organic light emitting diode OLED may be naturally discharged.

As described above, in the pixel 200 of the organic light emitting diode display device according to example embodiments, during the threshold voltage compensation period TCOMP, the emission control transistor 290 may disconnect the third node N3 from the anode of the organic light emitting diode OLED, and thus the threshold voltage compensation operation for the driving transistor 230 may not be affected by the parasitic capacitor COLED of the organic light emitting diode OLED. Accordingly, the threshold voltage of the driving transistor 230 may be compensated more accurately.

Figure 5:
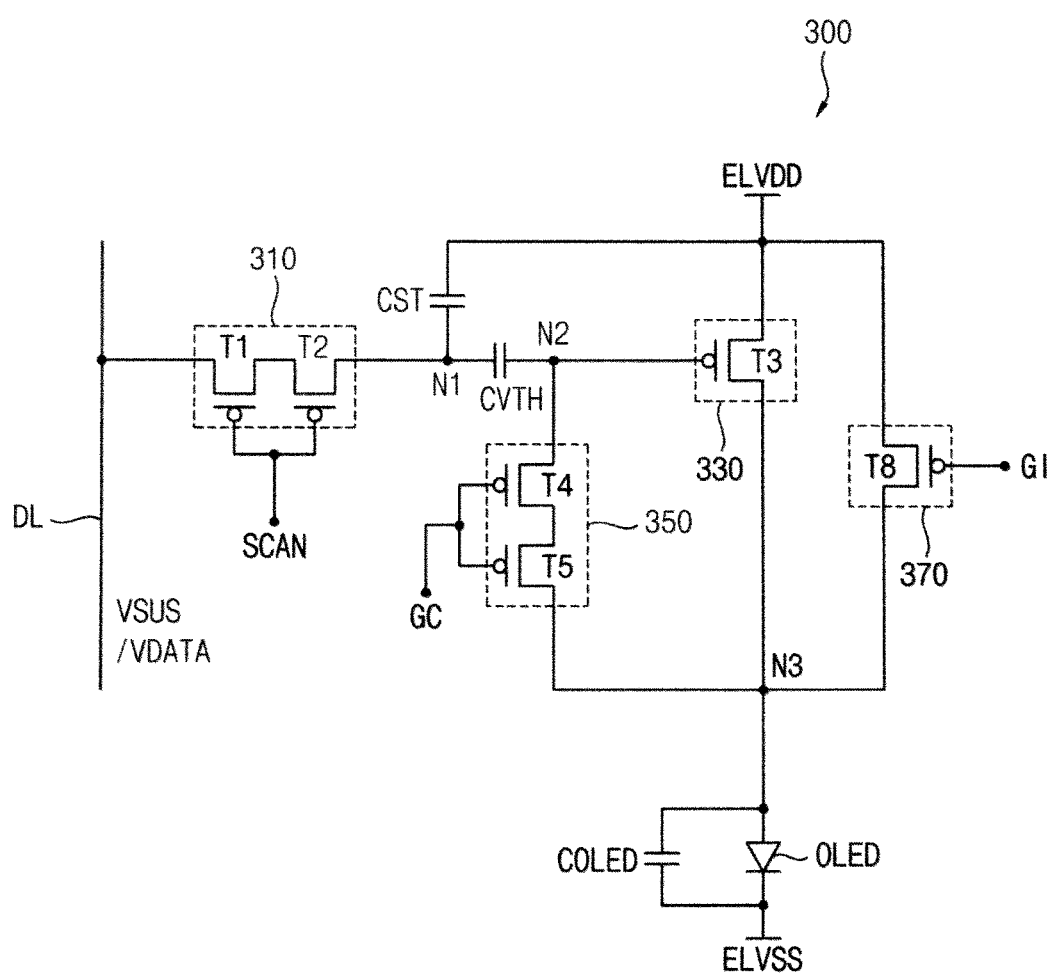
FIG. 5 is a circuit diagram illustrating a pixel of an organic light emitting diode display device according to example embodiments.
Figure 6:
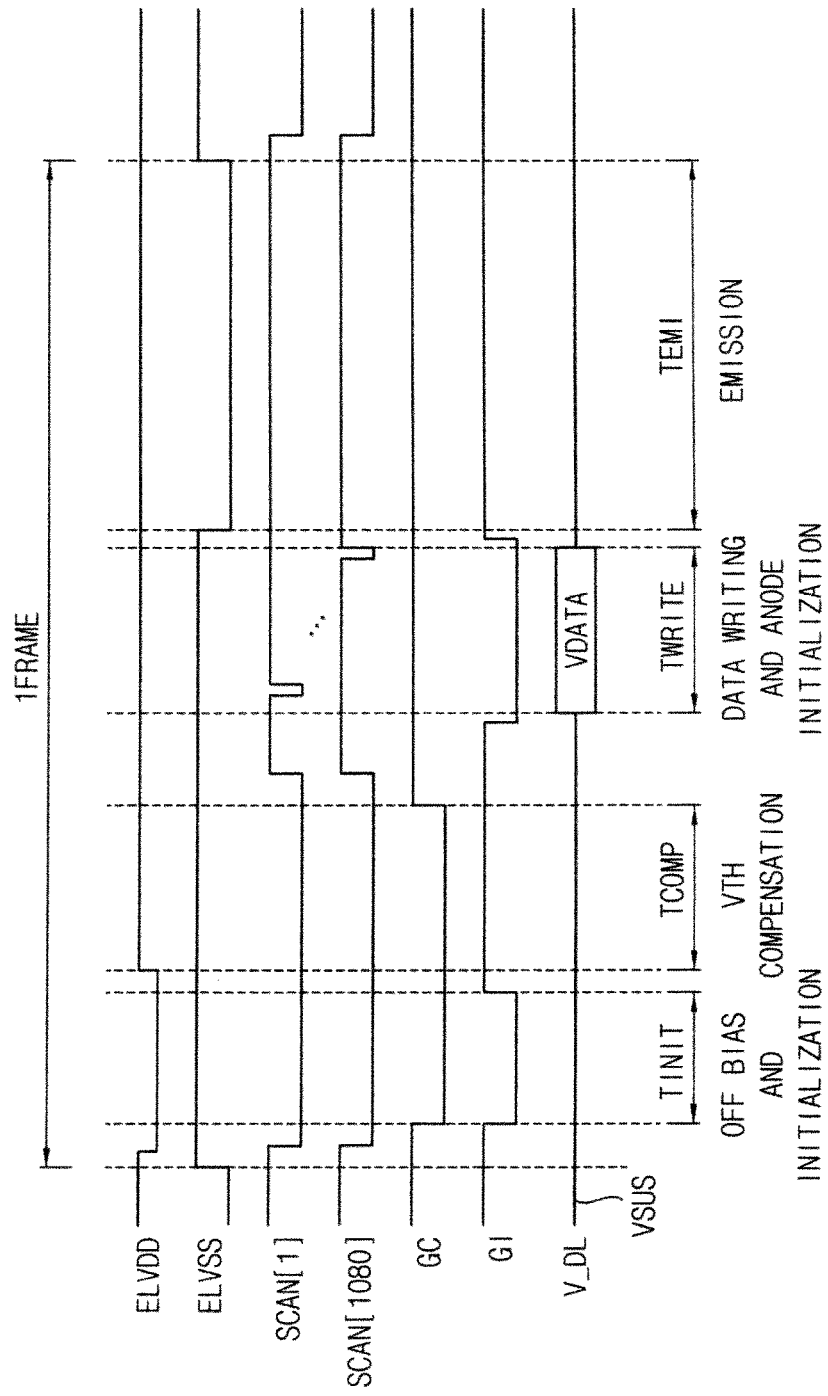
FIG. 6 is a timing diagram for illustrating an operation of a pixel of an organic light emitting diode display device illustrated in FIG. 5.

FIG. 5 is a circuit diagram illustrating a pixel of an organic light emitting diode display device according to example embodiments, and FIG. 6 is a timing diagram for illustrating an operation of a pixel of an organic light emitting diode display device illustrated in FIG. 5.

Referring to FIG. 5, a pixel 300 of an organic light emitting diode display device may include a scan transistor 310, a storage capacitor CST, a compensation transistor CVTH, a driving transistor 330, a compensation transistor 350, an organic light emitting diode OLED, and an initialization transistor 370. The pixel 300 of FIG. 5 may have a similar configuration to a pixel 100 of FIG. 1, except that the initialization transistor 370 may be connected between a first power supply voltage ELVDD and a third node N3. Further, an operation of the pixel 300 according to the timing diagram of FIG. 6 may be similar to an operation of the pixel 100 according to the timing diagram of FIG. 2, except that an initialization control signal GI having a low level may be applied during a data writing period TWRITE.

The initialization transistor 370 may transfer the first power supply voltage ELVDD to the third node N3 in response to the initialization control signal GI. In some example embodiments, the initialization transistor 370 may be implemented with a transistor T8 having a gate to which the initialization control signal GI is applied, a first terminal connected to the first power supply voltage ELVDD, and a second terminal connected to the third node N3.

As illustrated in FIG. 6, during the data writing period TWRITE, the initialization control signal GI having the low level may be applied to the initialization transistor 370, and the initialization transistor 370 may be turned on in response to the initialization control signal GI having the low level. Accordingly, during the data writing period TWRITE, the first power supply voltage ELVDD may be applied to the third node N3 (or an anode of the organic light emitting diode OLED), and thus the anode of the organic light emitting diode OLED may be initialized to the first power supply voltage ELVDD. That is, the anode of the organic light emitting diode OLED may be initialized during an initialization period TINIT, and may be reinitialized after a threshold voltage compensation period TCOMP and before an emission period TEMI, thereby further improving luminance uniformity of pixels 300 included in the organic light emitting diode display device.

Figure 7:
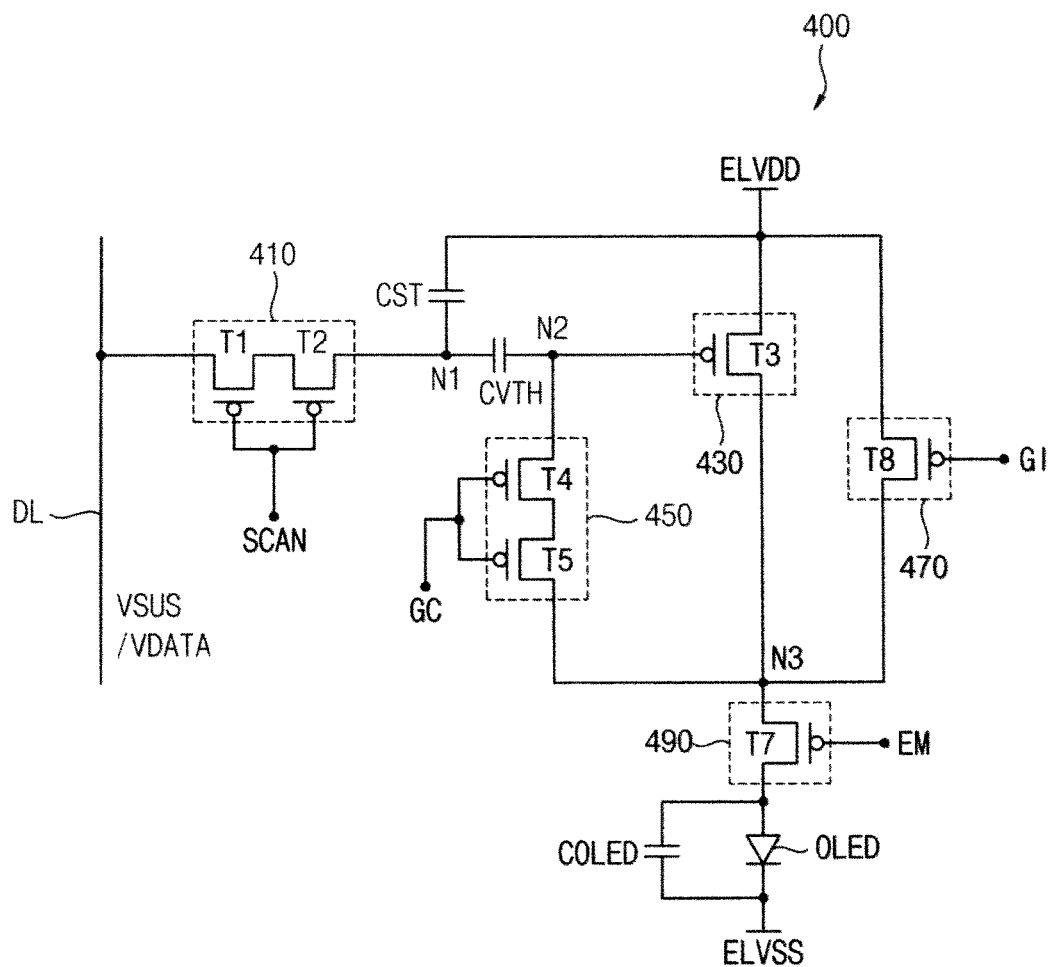
FIG. 7 is a circuit diagram illustrating a pixel of an organic light emitting diode display device according to example embodiments.

FIG. 7 is a circuit diagram illustrating a pixel of an organic light emitting diode display device according to example embodiments.

Referring to FIG. 7, a pixel 400 of an organic light emitting diode display device may include a scan transistor 410, a storage capacitor CST, a compensation transistor CVTH, a driving transistor 430, a compensation transistor 450, an organic light emitting diode OLED, an initialization transistor 470, and an emission control transistor 490. The pixel 400 of FIG. 7 may have a similar configuration to a pixel 300 of FIG. 5, except that the pixel 400 may further include the emission control transistor 490.

In the pixel 400 of the organic light emitting diode display device according to example embodiments, during a threshold voltage compensation period, the emission control transistor 490 may disconnect a third node N3 from an anode of the organic light emitting diode OLED, and thus a threshold voltage compensation operation for the driving transistor 430 may not be affected by a parasitic capacitor COLED of the organic light emitting diode OLED. Accordingly, a threshold voltage of the driving transistor 430 may be compensated more accurately.

Figure 8:
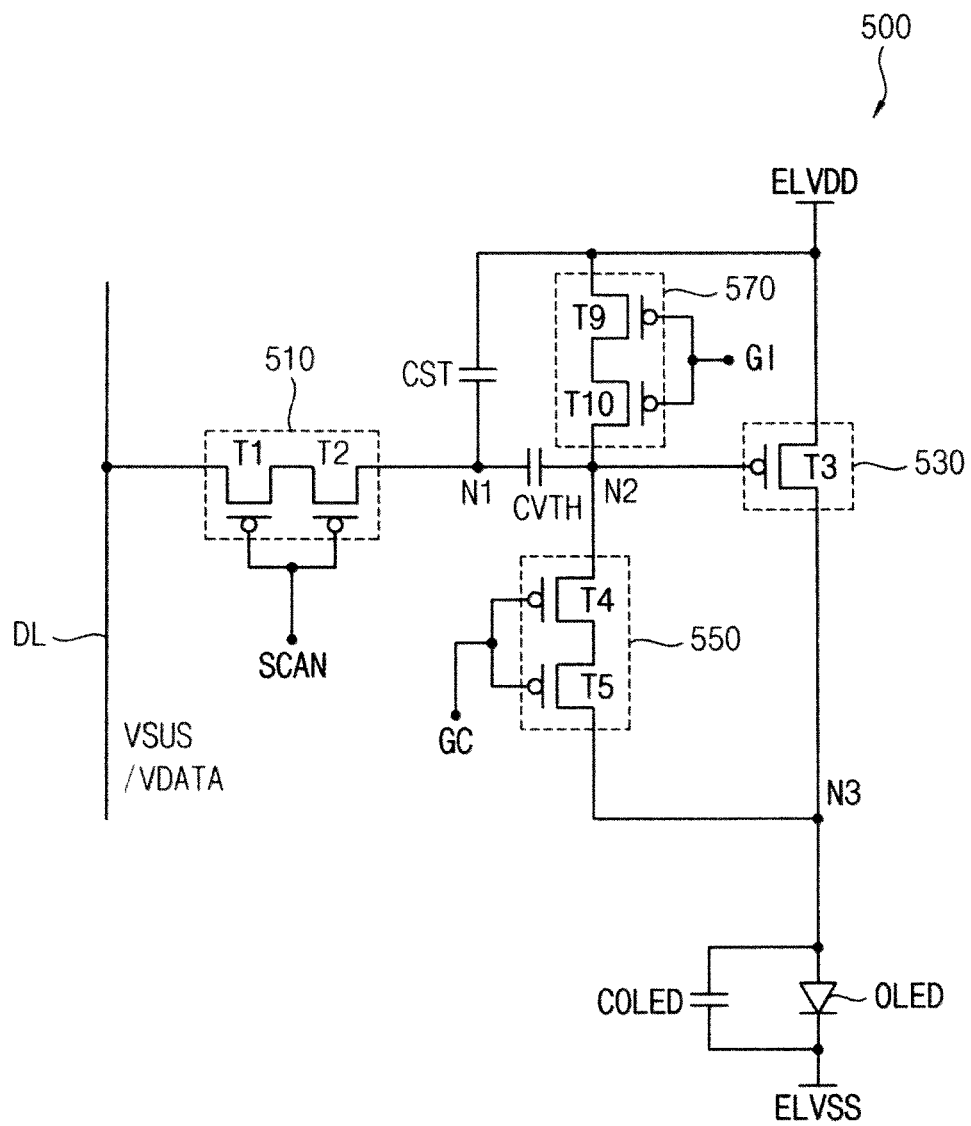
FIG. 8 is a circuit diagram illustrating a pixel of an organic light emitting diode display device according to example embodiments.

FIG. 8 is a circuit diagram illustrating a pixel of an organic light emitting diode display device according to example embodiments.

Referring to FIG. 8, a pixel 500 of an organic light emitting diode display device may include a scan transistor 510, a storage capacitor CST, a compensation transistor CVTH, a driving transistor 530, a compensation transistor 550, an organic light emitting diode OLED, and an initialization transistor 570. The pixel 500 of FIG. 8 may have a similar configuration to a pixel 100 of FIG. 1, except that the initialization transistor 570 may be connected between a first power supply voltage ELVDD and a second node N2.

The initialization transistor 570 may transfer a first power supply voltage ELVDD to the second node N2 in response to an initialization control signal GI. The initialization transistor 570 may have a gate to which the initialization control signal GI is applied, a first terminal connected to the first power supply voltage ELVDD, and a second terminal connected to the second node N2. In some example embodiments, the initialization transistor 570 may have a dual gate structure including two transistors T9 and T10 connected in series between the first power supply voltage ELVDD and the second node N2. In this case, a leakage current through the initialization transistor 570 may be reduced.

Figure 9:
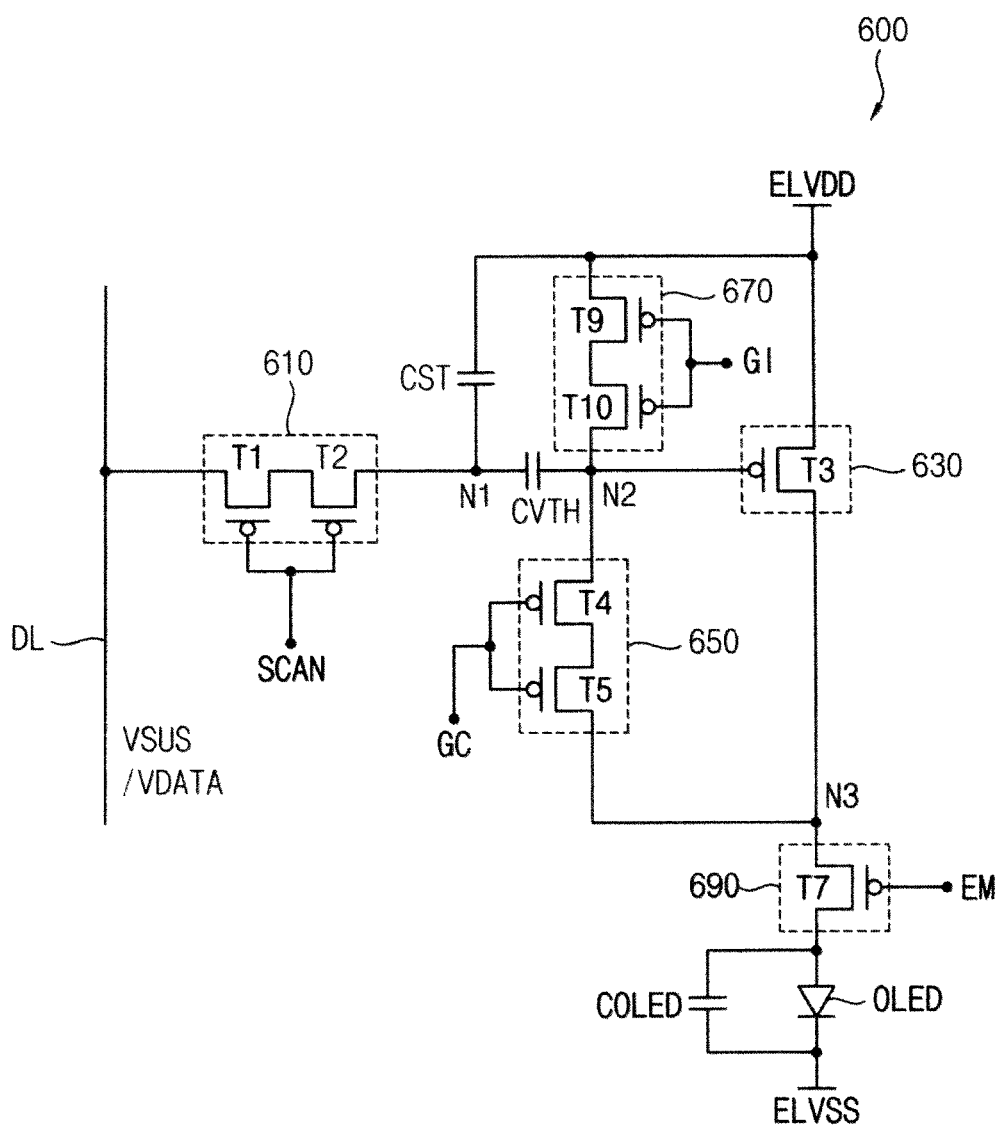
FIG. 9 is a circuit diagram illustrating a pixel of an organic light emitting diode display device according to example embodiments.

FIG. 9 is a circuit diagram illustrating a pixel of an organic light emitting diode display device according to example embodiments.

Referring to FIG. 9, a pixel 600 of an organic light emitting diode display device may include a scan transistor 610, a storage capacitor CST, a compensation transistor CVTH, a driving transistor 630, a compensation transistor 650, an organic light emitting diode OLED, an initialization transistor 670, and an emission control transistor 690. The pixel 600 of FIG. 9 may have a similar configuration to a pixel 500 of FIG. 8, except that the pixel 600 may further include the emission control transistor 690.

Figure 10:
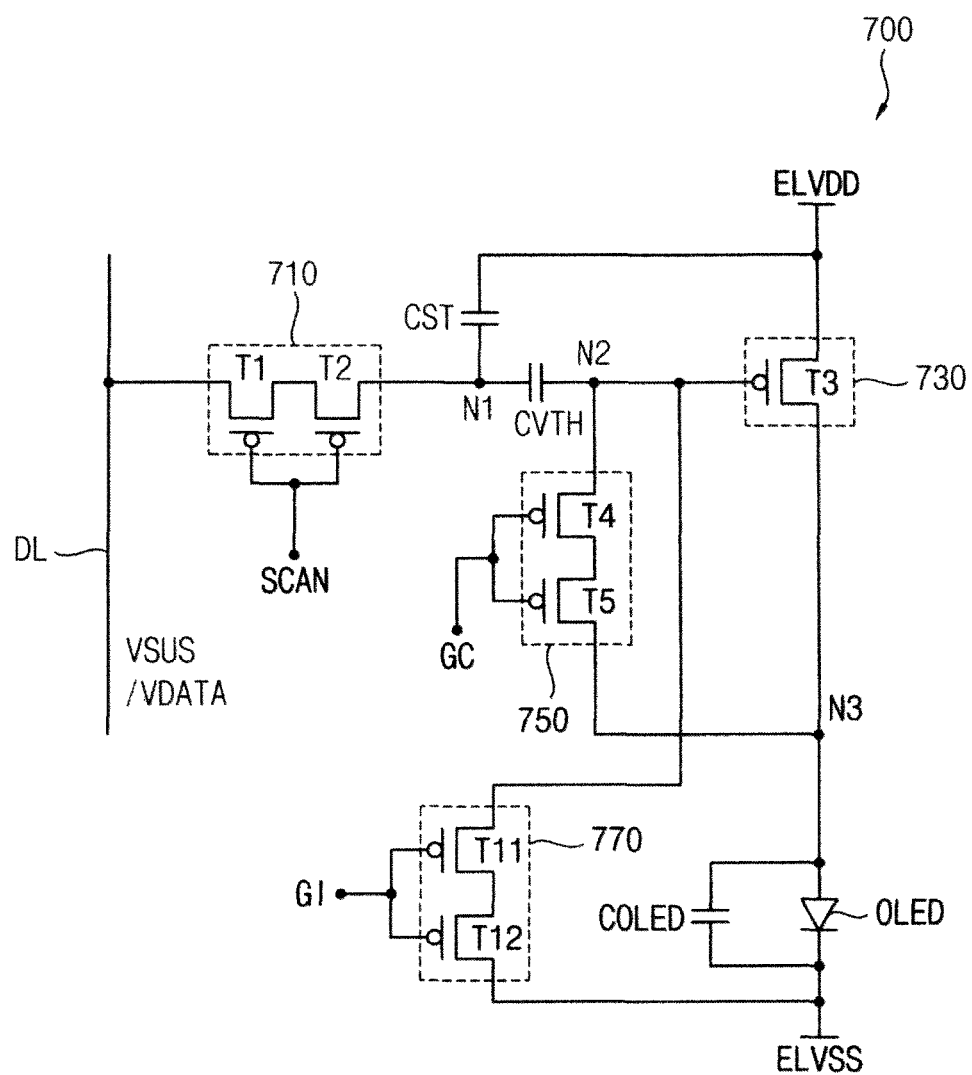
FIG. 10 is a circuit diagram illustrating a pixel of an organic light emitting diode display device according to example embodiments.
Figure 11:
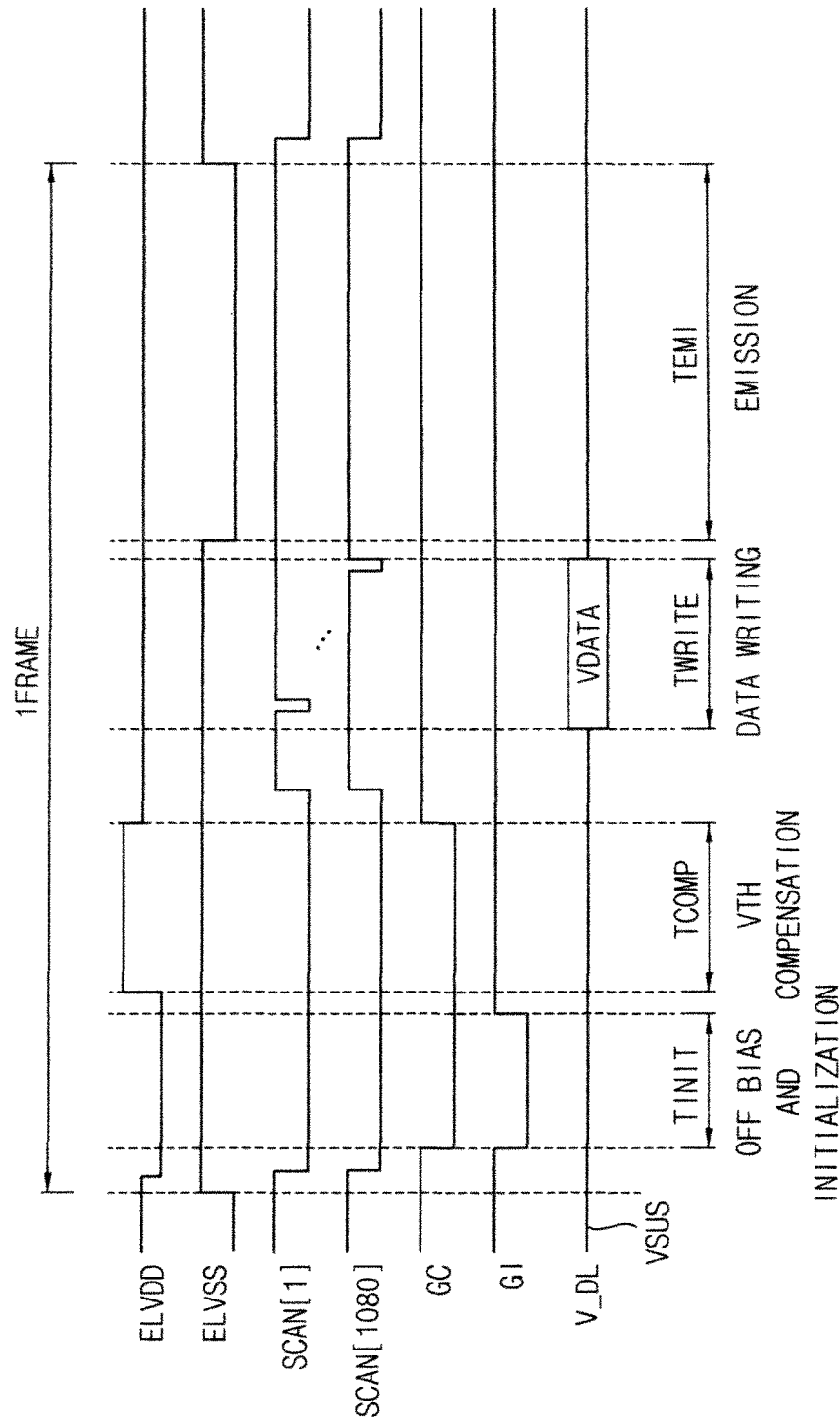
FIG. 11 is a timing diagram for illustrating an example of an operation of a pixel of an organic light emitting diode display device illustrated in FIG. 10.
Figure 12:
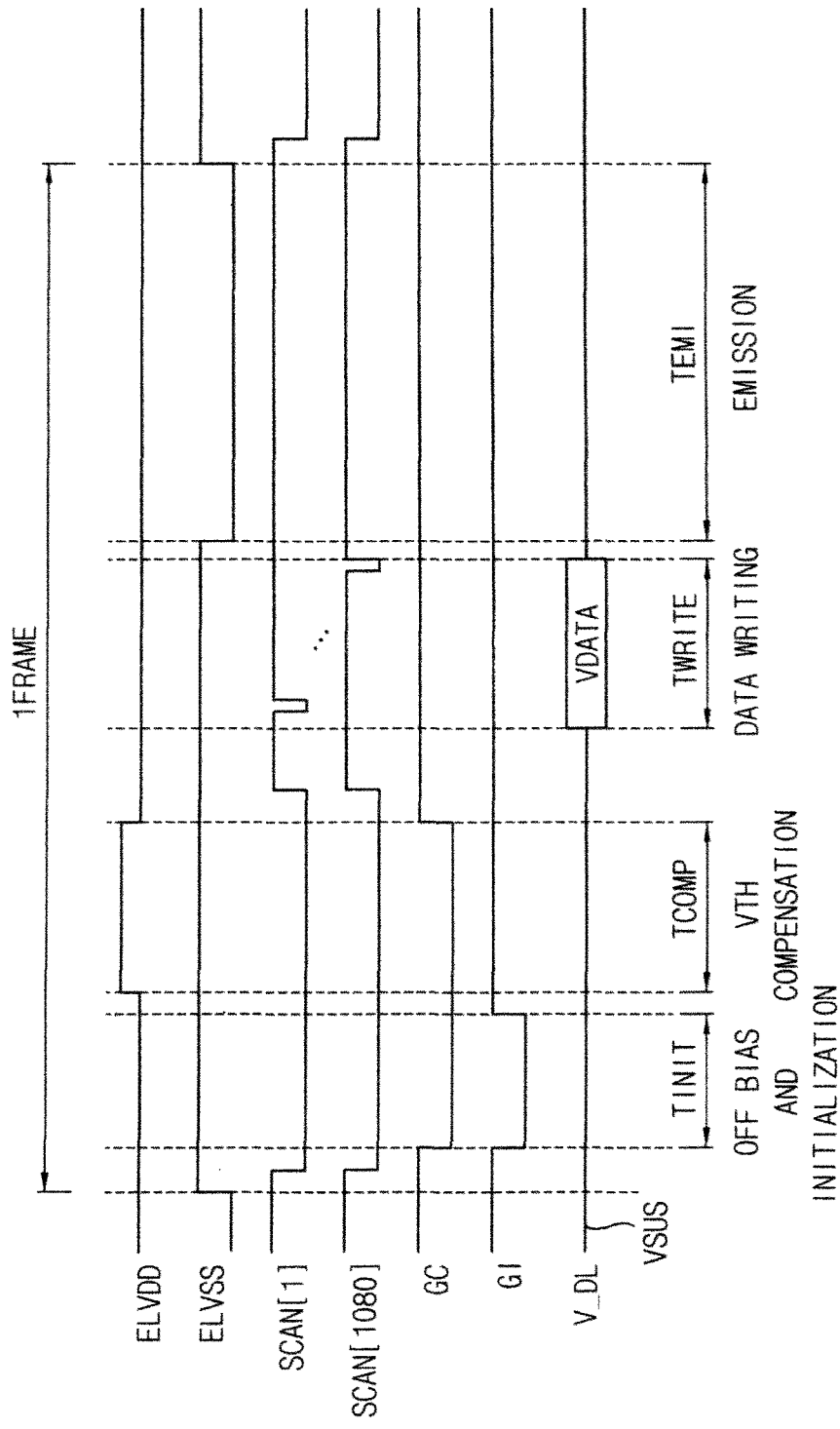
FIG. 12 is a timing diagram for illustrating another example of an operation of a pixel of an organic light emitting diode display device illustrated in FIG. 10.

FIG. 10 is a circuit diagram illustrating a pixel of an organic light emitting diode display device according to example embodiments, FIG. 11 is a timing diagram for illustrating an example of an operation of a pixel of an organic light emitting diode display device illustrated in FIG. 10, and FIG. 12 is a timing diagram for illustrating another example of an operation of a pixel of an organic light emitting diode display device illustrated in FIG. 10.

Referring to FIG. 10, a pixel 700 of an organic light emitting diode display device may include a scan transistor 710, a storage capacitor CST, a compensation transistor CVTH, a driving transistor 730, a compensation transistor 750, an organic light emitting diode OLED, and an initialization transistor 770. The pixel 700 of FIG. 10 may have a similar configuration to a pixel 100 of FIG. 1, except that the initialization transistor 770 may be connected between a second power supply voltage ELVSS and a second node N2.

The initialization transistor 770 may transfer, as an initialization voltage, a second power supply voltage ELVSS to the second node N2 in response to an initialization control signal GI. The initialization transistor 770 may have a gate to which the initialization control signal GI is applied, a first terminal connected to the second power supply voltage ELVSS, and a second terminal connected to the second node N2. In some example embodiments, the initialization transistor 770 may have a dual gate structure including two transistors T11 and T12 connected in series between the second power supply voltage ELVSS and the second node N2. In this case, a leakage current through the initialization transistor 770 may be reduced.

In the pixel 700 of the organic light emitting diode display device, when the driving transistor 730 is initialized to an off-bias state, a gate-source voltage of the driving transistor 730 may be about 0 V, and a drain-source voltage of the driving transistor 730 may be determined according to an operating characteristic of the driving transistor 730.

In some example embodiments, as illustrated in FIG. 11, before an initialization period TINIT, the second power supply voltage ELVSS may be increased from a first ELVSS voltage level (e.g., about 0 V) to a second ELVSS voltage level (e.g., about 13 V), and a first power supply voltage ELVDD may be decreased from a first ELVDD voltage level (e.g., about 13 V) to a second ELVDD voltage level (e.g., about 6 V).

During the initialization period TINIT, the second power supply voltage ELVSS having the second ELVSS voltage level may be applied to the second node N2 and a third node N3 through the initialization transistor 770 and the compensation transistor 750. Thus, the gate-source voltage of the driving transistor 730 may be about 0 V, and the drain-source voltage of the driving transistor 730 may be about 7 V. That is, in an example embodiment illustrated in FIG. 11, during the initialization period TINIT, the driving transistor 730 may be initialized to the off-bias state where the gate-source voltage of about 0 V and the drain-source voltage of about 7 V are applied.

A threshold voltage compensation operation for the driving transistor 730 may be initiated by increasing the first power supply voltage ELVDD from the second ELVDD voltage level to a third ELVDD voltage level (e.g., about 16 V) that is higher than the second ELVSS voltage level. That is, the first power supply voltage ELVDD may be increased to be higher than a voltage of the second node N2 (or a gate voltage of the driving transistor 730), and thus the threshold voltage compensation operation may be initiated.

In other example embodiments, as illustrated in FIG. 12, before the initialization period TINIT, the second power supply voltage ELVSS may be increased from the first ELVSS voltage level (e.g., about 0 V) to the second ELVSS voltage level (e.g., about 13 V), and the first power supply voltage ELVDD may be maintained at the first ELVDD voltage level.

During the initialization period TINIT, the second power supply voltage ELVSS having the second ELVSS voltage level that is substantially the same as the first ELVDD voltage level may be applied to the second node N2 and a third node N3 through the initialization transistor 770 and the compensation transistor 750. Thus, the gate-source voltage of the driving transistor 730 may be about 0 V, and the drain-source voltage of the driving transistor 730 may also be about 0 V. That is, in an example embodiment illustrated in FIG. 12, during the initialization period TINIT, the driving transistor 730 may be initialized to the off-bias state where the gate-source voltage of about 0 V and the drain-source voltage of about 0 V are applied.

A threshold voltage compensation operation for the driving transistor 730 may be initiated by increasing the first power supply voltage ELVDD from the first ELVDD voltage level to a third ELVDD voltage level (e.g., about 16 V) that is higher than the second ELVSS voltage level.

Although FIG. 11 illustrates an example where the drain-source voltage of the driving transistor 730 is about 7 V and FIG. 12 illustrates an example where the drain-source voltage of the driving transistor 730 is about 0 V, in other example embodiments, the voltage level of the first power supply voltage ELVDD during the initialization period TINIT may be determined according to the operating characteristic of the driving transistor 730.

Figure 13:
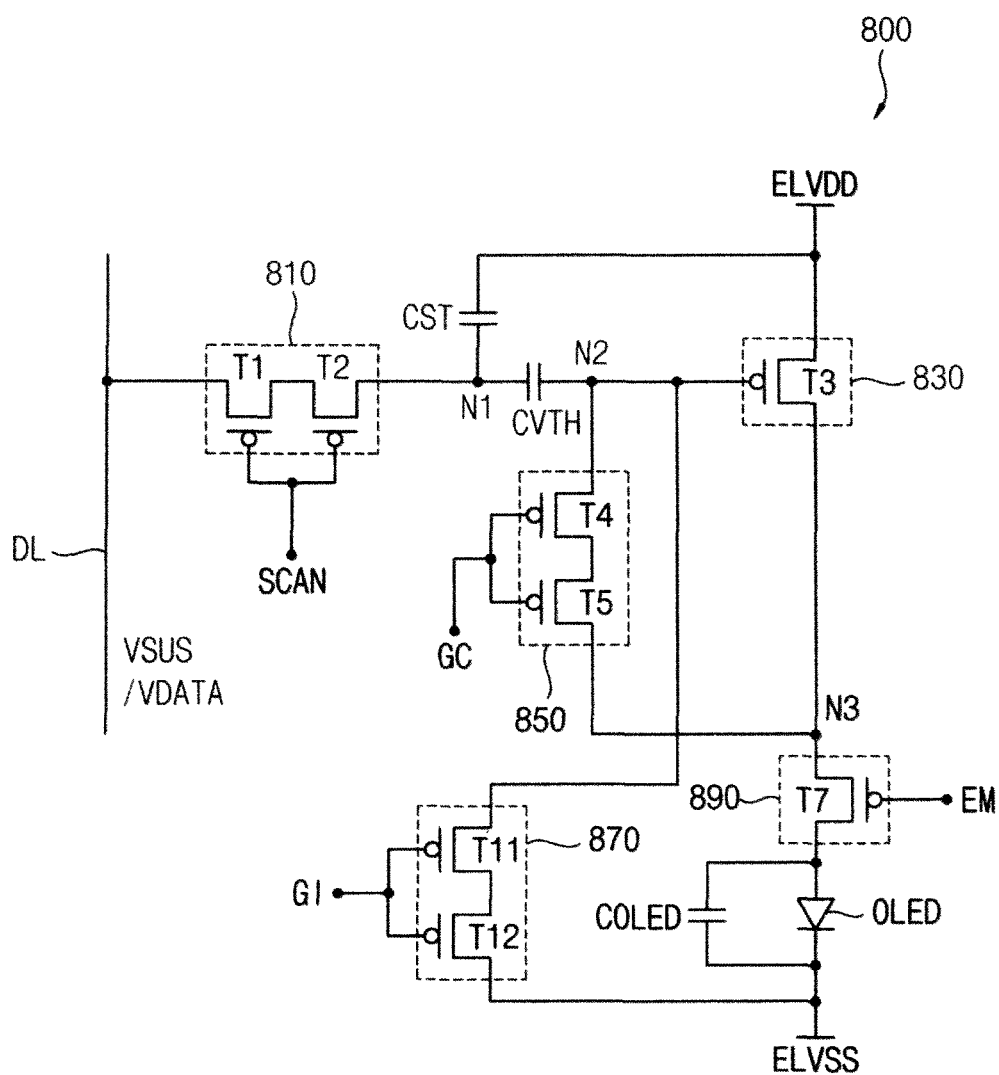
FIG. 13 is a circuit diagram illustrating a pixel of an organic light emitting diode display device according to example embodiments.
Figure 14:
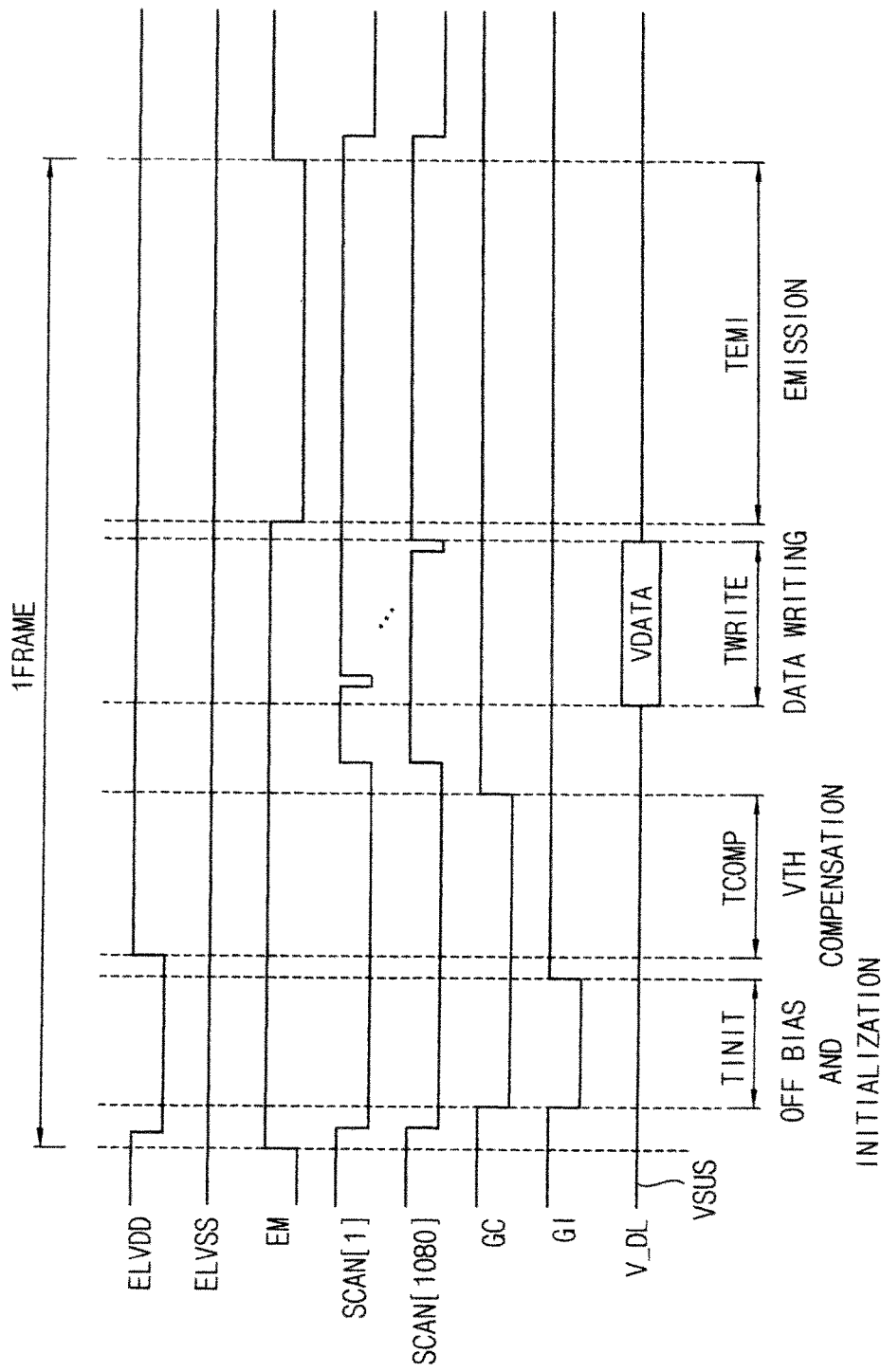
FIG. 14 is a timing diagram for illustrating an operation of a pixel of an organic light emitting diode display device illustrated in FIG. 13.

FIG. 13 is a circuit diagram illustrating a pixel of an organic light emitting diode display device according to example embodiments, and FIG. 14 is a timing diagram for illustrating an operation of a pixel of an organic light emitting diode display device illustrated in FIG. 13.

Referring to FIG. 13, a pixel 800 of an organic light emitting diode display device may include a scan transistor 810, a storage capacitor CST, a compensation transistor CVTH, a driving transistor 830, a compensation transistor 850, an organic light emitting diode OLED, an initialization transistor 870, and an emission control transistor 890 connected between a third node N3 and an anode of the organic light emitting diode OLED. Compared with the pixel 700 of FIG. 10, the pixel 800 of FIG. 13 may further include the emission control transistor 890. The emission control transistor 890 may selectively connect the third node N3 to the organic light emitting diode OLED in response to an emission control signal EM.

Referring to FIGS. 13 and 14, when a frame is started, the emission control signal EM having a high level may be applied to the emission control transistor 890, the emission control transistor 890 may be turned off in response to the emission control signal EM having the high level, and thus the pixel 800 may not emit light. In an example embodiment illustrated in FIG. 14, unlike an example embodiment illustrated in FIG. 12, the second power supply voltage ELVSS may be constant at a first ELVSS voltage level (e.g., about 0V).

As illustrated in FIG. 14, before an initialization period TINIT, a first power supply voltage ELVDD may be decreased from a first ELVDD voltage level (e.g., about 13 V) to a fourth ELVDD voltage level (e.g., about 0 V) that is substantially the same as the first ELVSS voltage level. Accordingly, during the initialization period TINIT, the driving transistor 830 may be initialized to an off-bias state where a gate-source voltage of about 0 V and a drain-source voltage of about 0 V are applied. A threshold voltage compensation operation for the driving transistor 830 may be initiated by increasing the first power supply voltage ELVDD from the fourth ELVDD voltage level to the first ELVDD voltage level (e.g., about 13 V).

Figure 15:
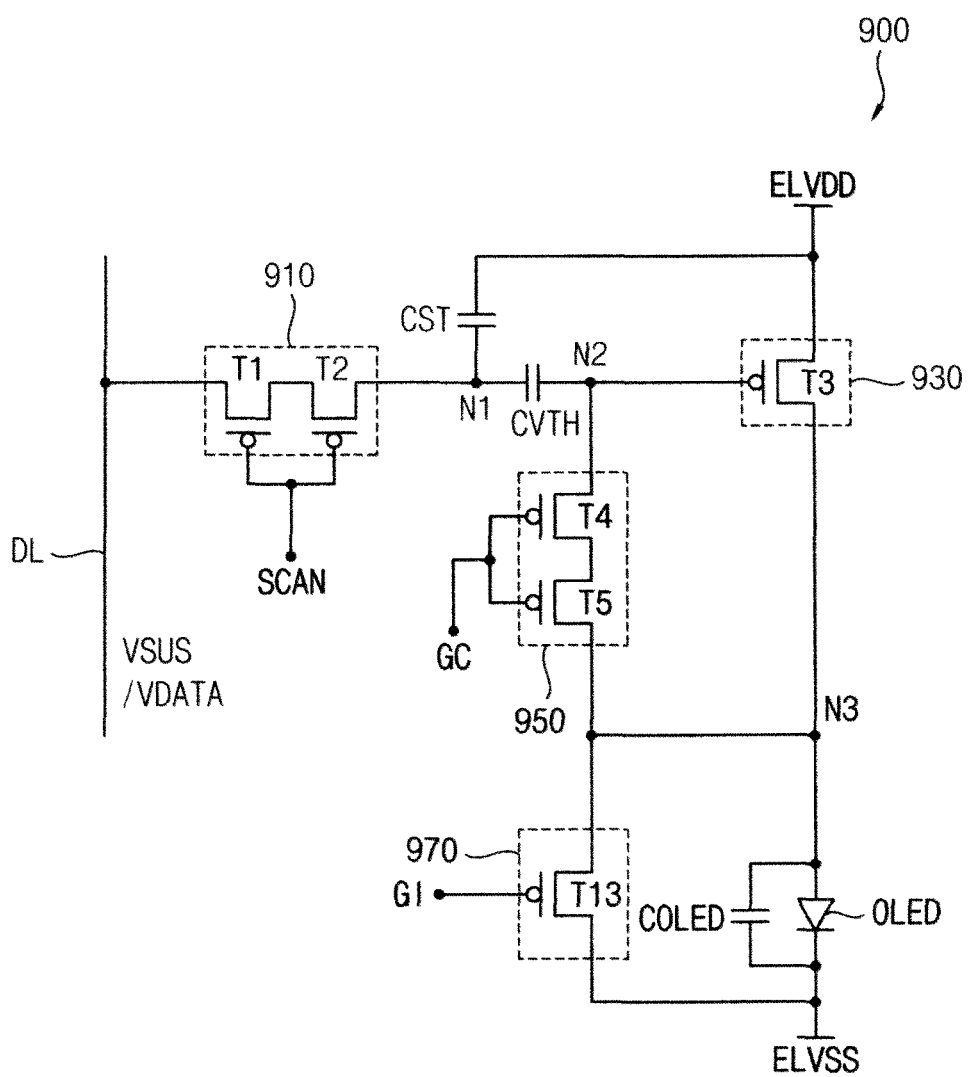
FIG. 15 is a circuit diagram illustrating a pixel of an organic light emitting diode display device according to example embodiments.
Figure 16:
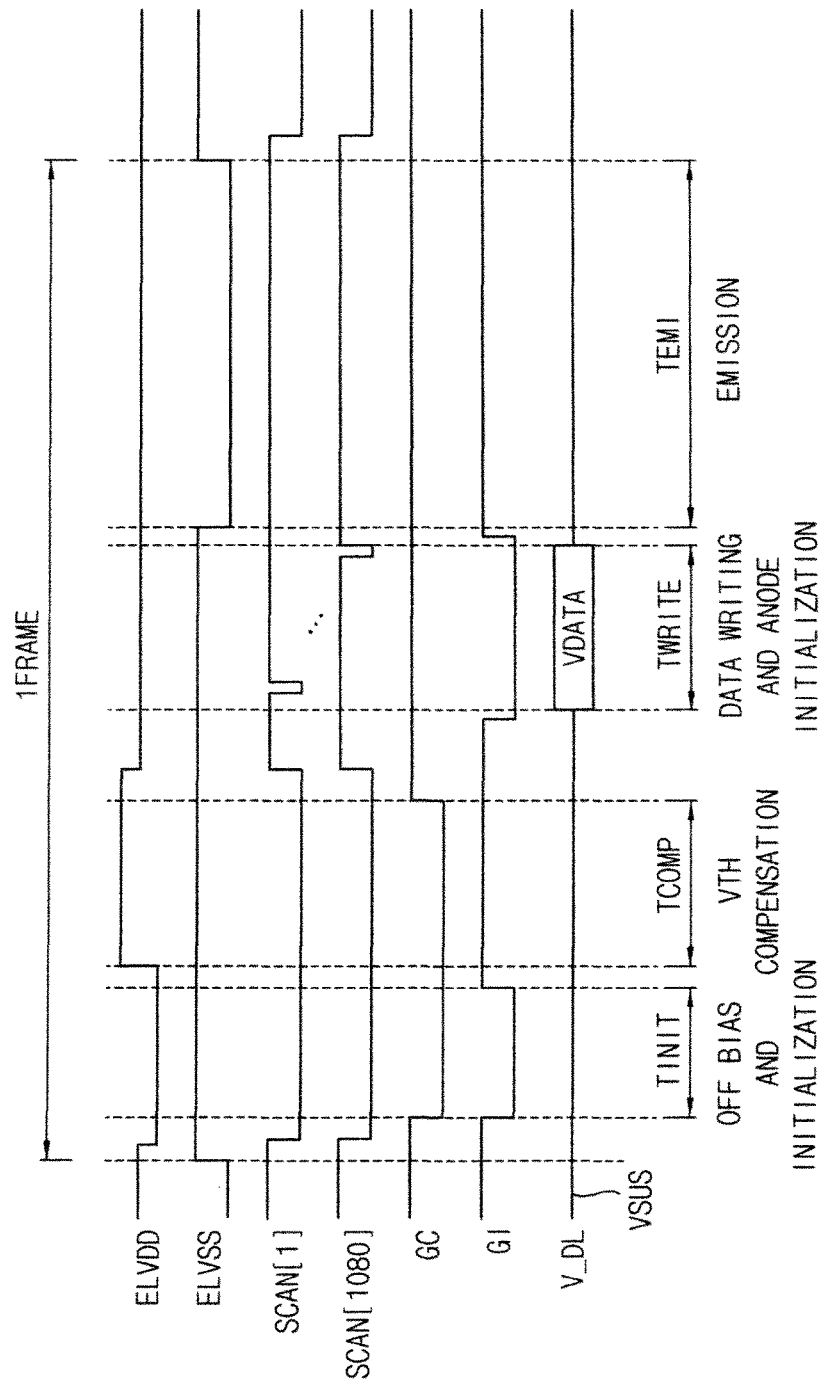
FIG. 16 is a timing diagram for illustrating an operation of a pixel of an organic light emitting diode display device illustrated in FIG. 15.

FIG. 15 is a circuit diagram illustrating a pixel of an organic light emitting diode display device according to example embodiments, and FIG. 16 is a timing diagram for illustrating an operation of a pixel of an organic light emitting diode display device illustrated in FIG. 15.

Referring to FIG. 15, a pixel 900 of an organic light emitting diode display device may include a scan transistor 910, a storage capacitor CST, a compensation transistor CVTH, a driving transistor 930, a compensation transistor 950, an organic light emitting diode OLED, and an initialization transistor 970. The pixel 900 of FIG. 15 may have a similar configuration to a pixel 100 of FIG. 1, except that the initialization transistor 970 may be connected between a second power supply voltage ELVSS and a third node N3.

The initialization transistor 970 may transfer the second power supply voltage ELVSS to the third node N3 in response to an initialization control signal GI. The initialization transistor 970 may be implemented with a transistor T13 having a gate to which the initialization control signal GI is applied, a first terminal connected to the second power supply voltage ELVSS, and a second terminal connected to the third node N3.

In the pixel 900 of the organic light emitting diode display device, when the driving transistor 930 is initialized to an off-bias state, a gate-source voltage of the driving transistor 930 may be about 0 V, and a drain-source voltage of the driving transistor 930 may be determined according to an operating characteristic of the driving transistor 930.

In some example embodiments, as illustrated in FIG. 16, before an initialization period TINIT, the second power supply voltage ELVSS may be increased from a first ELVSS voltage level (e.g., about 0 V) to a second ELVSS voltage level (e.g., about 13 V), and a first power supply voltage ELVDD may be decreased from a first ELVDD voltage level to a second ELVDD voltage level (e.g., about 6 V). Thus, during the initialization period TINIT, the driving transistor 930 may be initialized to the off-bias state where the gate-source voltage of about 0 V and the drain-source voltage of about 7 V are applied.

A threshold voltage compensation operation for the driving transistor 930 may be initiated by increasing the first power supply voltage ELVDD from the second ELVDD voltage level to a third ELVDD voltage level (e.g., about 16 V) that is higher than the second ELVSS voltage level. Further, during a data writing period TWRITE, the initialization control signal GI having a low level may be applied to the initialization transistor 970, and the initialization transistor 970 may be turned on in response to the initialization control signal GI having the low level. Accordingly, during the data writing period TWRITE, the second power supply voltage ELVSS having the second ELVSS voltage level may be applied to the third node N3 (or an anode of the organic light emitting diode OLED), and thus the anode of the organic light emitting diode OLED may be initialized to the second power supply voltage ELVSS having the second ELVSS voltage level. Because the anode of the organic light emitting diode OLED is reinitialized after a threshold voltage compensation period TCOMP and before an emission period TEMI, luminance uniformity of pixels included in the organic light emitting diode display device may be further improved.

Figure 17:
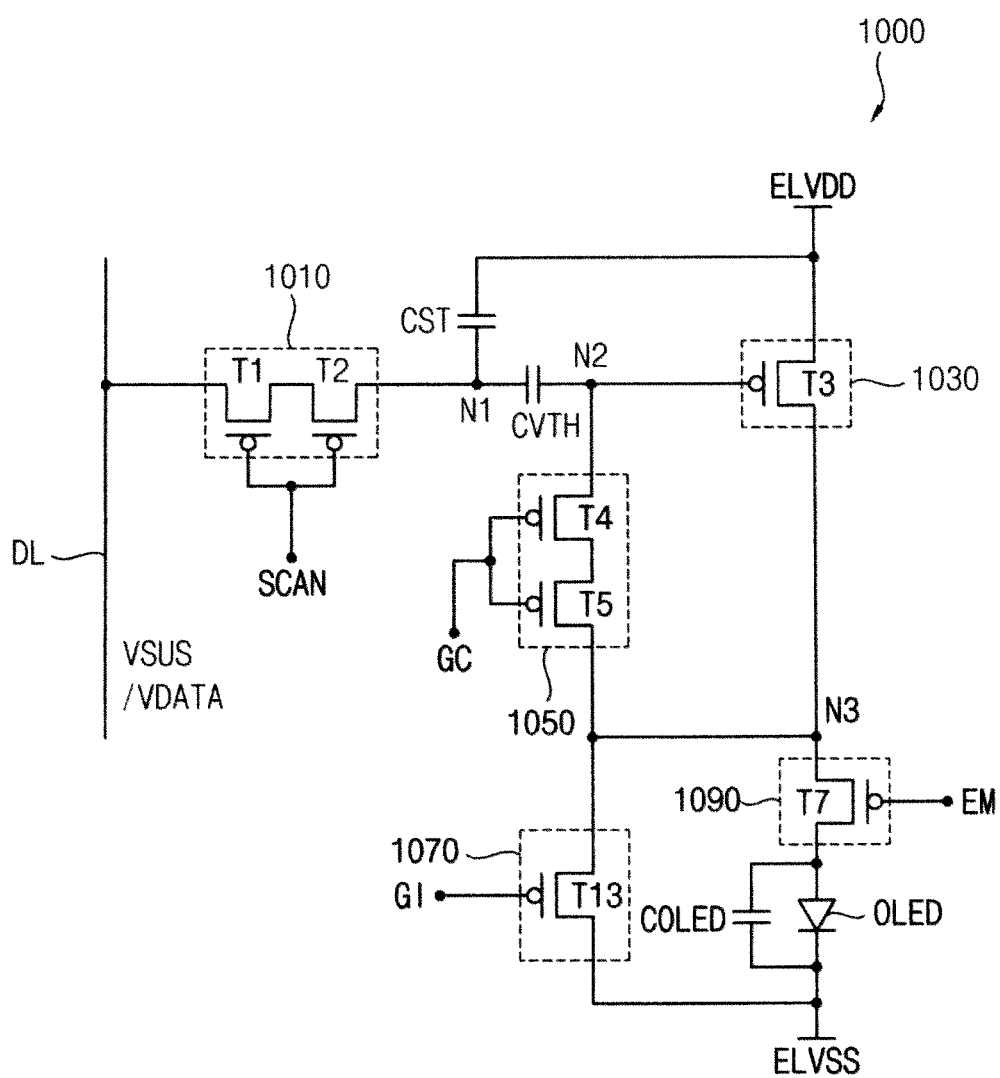
FIG. 17 is a circuit diagram illustrating a pixel of an organic light emitting diode display device according to example embodiments.

FIG. 17 is a circuit diagram illustrating a pixel of an organic light emitting diode display device according to example embodiments.

Referring to FIG. 17, a pixel 1000 of an organic light emitting diode display device may include a scan transistor 1010, a storage capacitor CST, a compensation transistor CVTH, a driving transistor 1030, a compensation transistor 1050, an organic light emitting diode OLED, an initialization transistor 1070, and an emission control transistor 1090. The pixel 1000 of FIG. 17 may have a similar configuration to a pixel 900 of FIG. 15, except that the pixel 1000 may further include the emission control transistor 1090.

Figure 18:
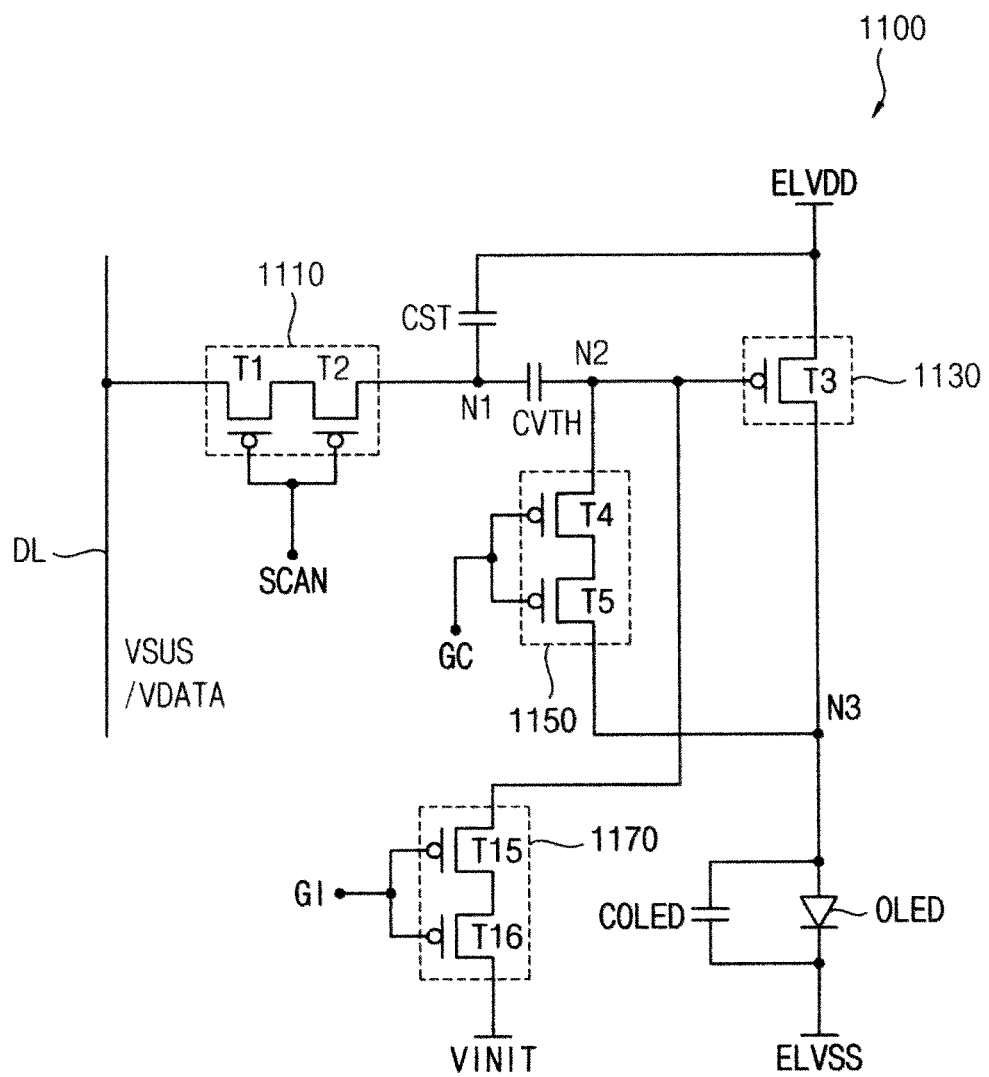
FIG. 18 is a circuit diagram illustrating a pixel of an organic light emitting diode display device according to example embodiments.

FIG. 18 is a circuit diagram illustrating a pixel of an organic light emitting diode display device according to example embodiments.

Referring to FIG. 18, a pixel 1100 of an organic light emitting diode display device may include a scan transistor 1110, a storage capacitor CST, a compensation transistor CVTH, a driving transistor 1130, a compensation transistor 1150, an organic light emitting diode OLED, and an initialization transistor 1170. The pixel 1100 of FIG. 18 may have a similar configuration to a pixel 100 of FIG. 1, except that the initialization transistor 1170 may be connected between a second node N2 and an initialization voltage VINIT that is different from first and second power supply voltages ELVDD and ELVSS.

The initialization transistor 1170 may transfer the initialization voltage VINIT applied through an initialization voltage line to the second node N2 in response to an initialization control signal GI. The initialization transistor 1170 may have a gate to which the initialization control signal GI is applied, a first terminal connected to the initialization voltage line, and a second terminal connected to the second node N2. In some example embodiments, the initialization transistor 1170 may have a dual gate structure including two transistors T15 and T16 connected in series between the initialization voltage line and the second node N2.

In the pixel 1100 of the organic light emitting diode display device, when the driving transistor 1130 is initialized to an off-bias state, a voltage level of the initialization voltage VINIT and/or a voltage level of the first power supply voltage ELVDD may be adjusted to determine a gate-source voltage of the driving transistor 1130 as a positive voltage, about 0 V, or a negative voltage according to an operating characteristic of the driving transistor 1130.

Figure 19:
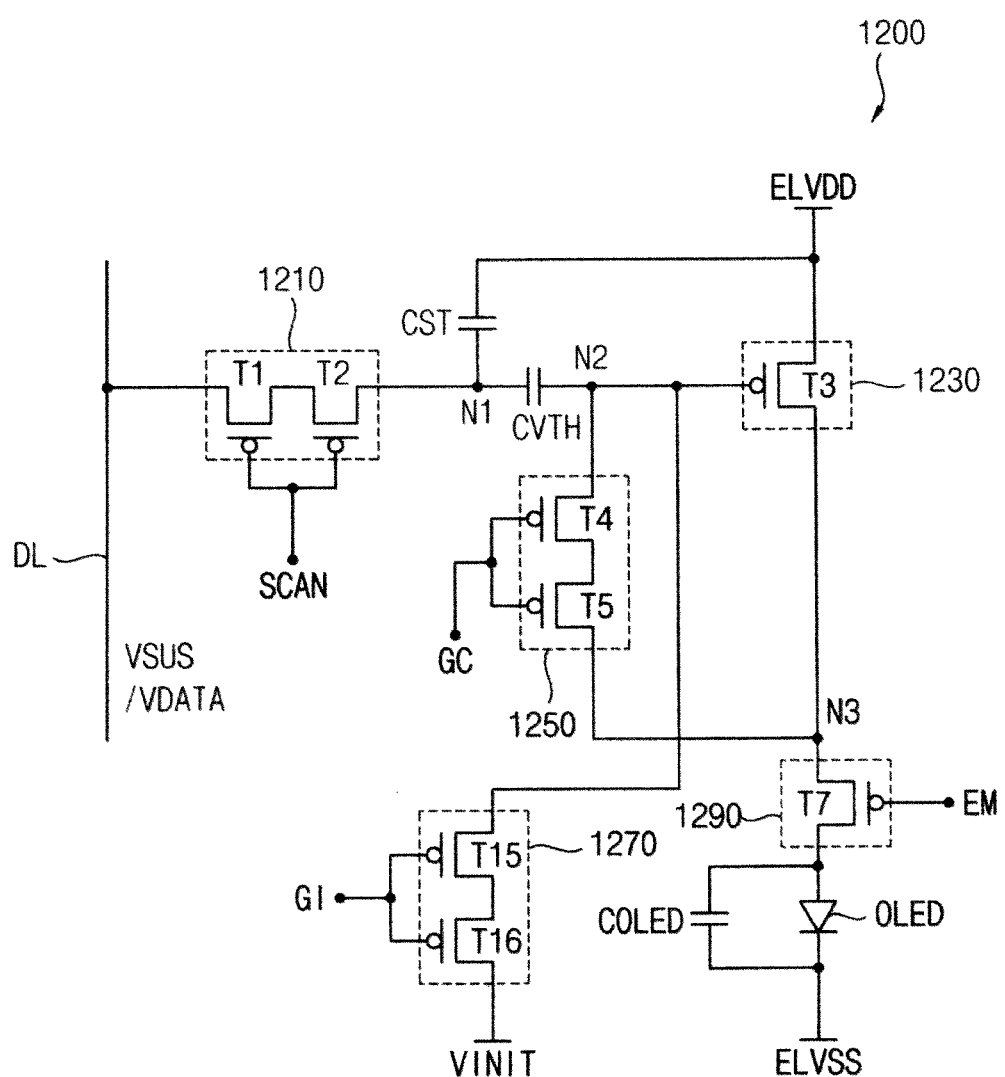
FIG. 19 is a circuit diagram illustrating a pixel of an organic light emitting diode display device according to example embodiments.

FIG. 19 is a circuit diagram illustrating a pixel of an organic light emitting diode display device according to example embodiments.

Referring to FIG. 19, a pixel 1200 of an organic light emitting diode display device may include a scan transistor 1210, a storage capacitor CST, a compensation transistor CVTH, a driving transistor 1230, a compensation transistor 1250, an organic light emitting diode OLED, an initialization transistor 1270, and an emission control transistor 1290. The pixel 1200 of FIG. 19 may have a similar configuration to a pixel 1100 of FIG. 18, except that the pixel 1200 may further include the emission control transistor 1290.

Figure 20:
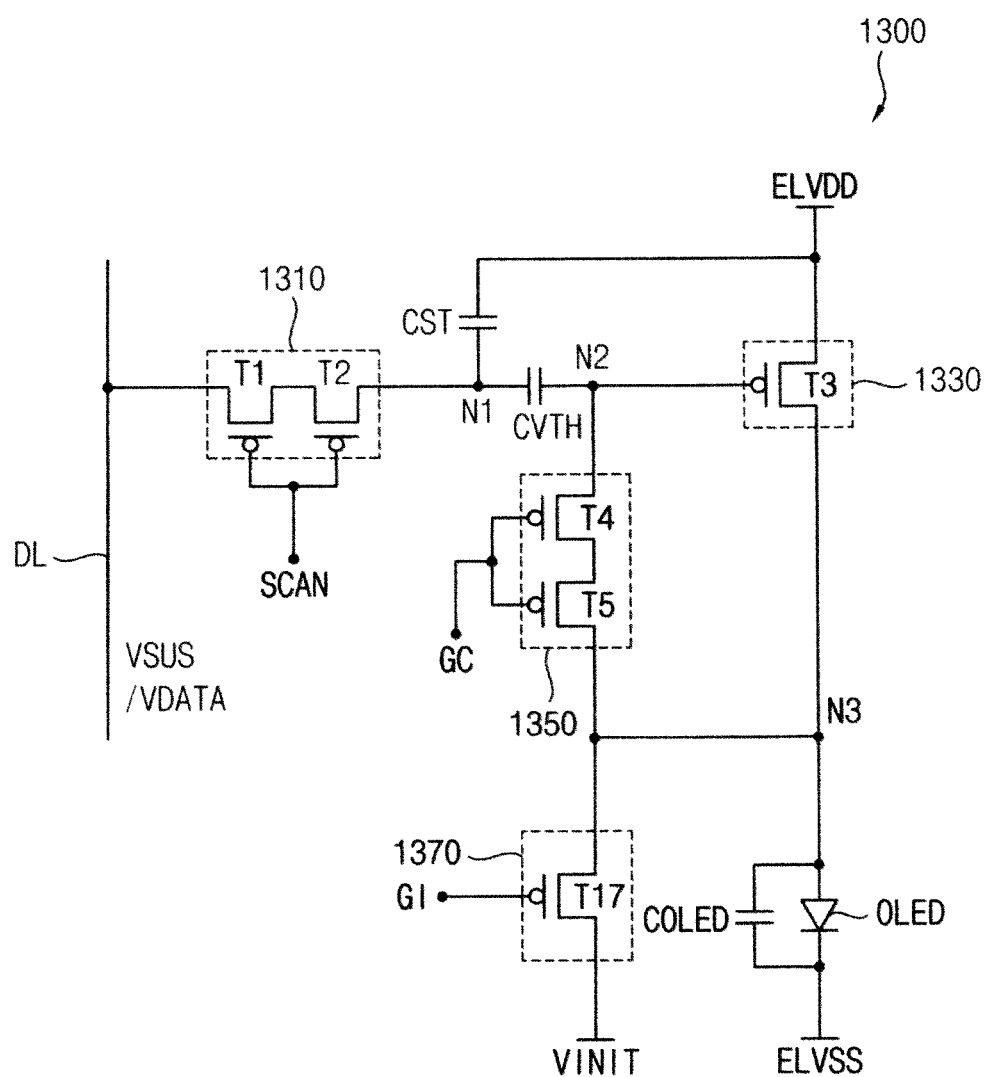
FIG. 20 is a circuit diagram illustrating a pixel of an organic light emitting diode display device according to example embodiments.
Figure 21:
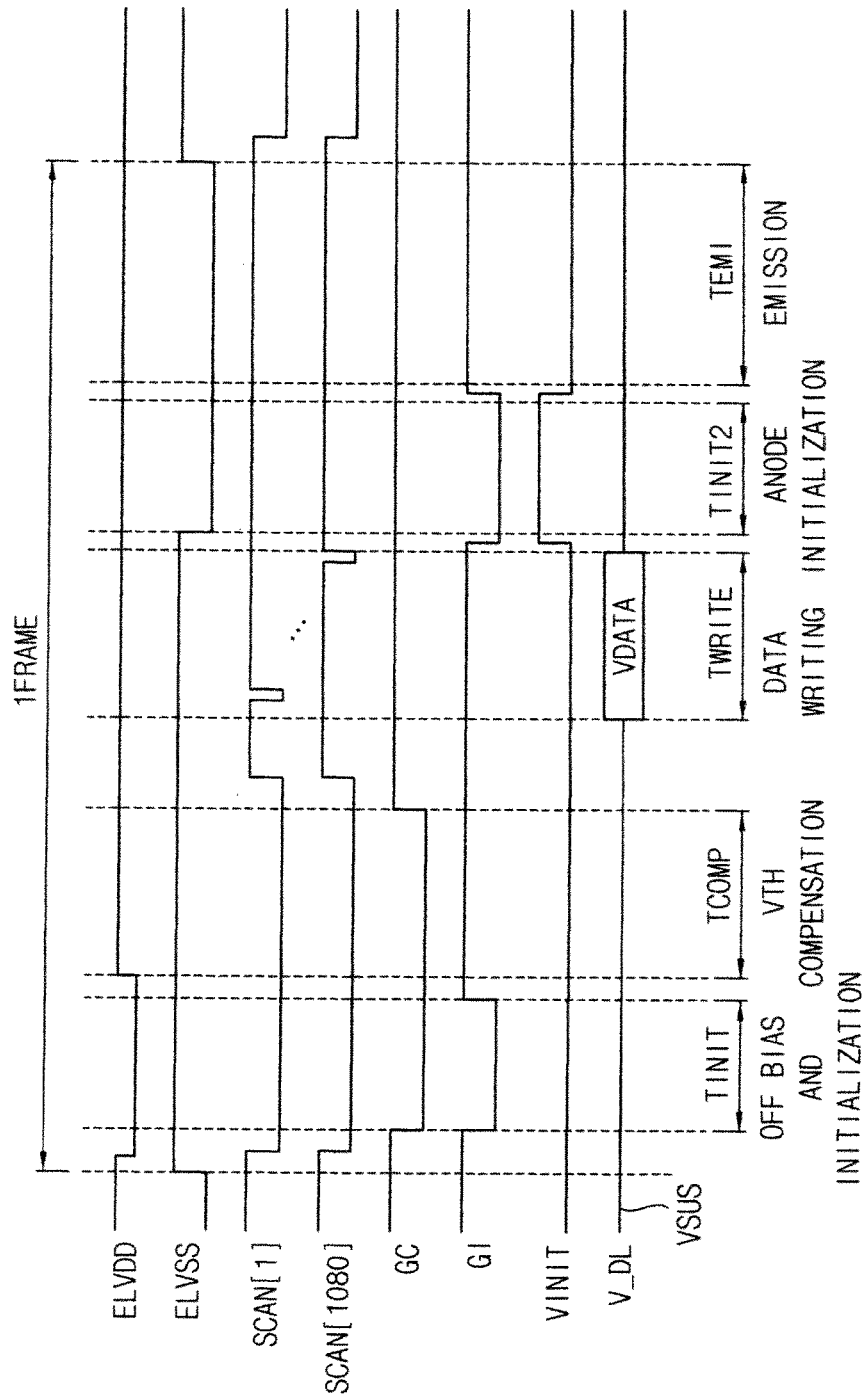
FIG. 21 is a timing diagram for illustrating an operation of a pixel of an organic light emitting diode display device illustrated in FIG. 20.

FIG. 20 is a circuit diagram illustrating a pixel of an organic light emitting diode display device according to example embodiments, and FIG. 21 is a timing diagram for illustrating an operation of a pixel of an organic light emitting diode display device illustrated in FIG. 20.

Referring to FIG. 20, a pixel 1300 of an organic light emitting diode display device may include a scan transistor 1310, a storage capacitor CST, a compensation transistor CVTH, a driving transistor 1330, a compensation transistor 1350, an organic light emitting diode OLED, and an initialization transistor 1370. The pixel 1300 of FIG. 20 may have a similar configuration to a pixel 100 of FIG. 1, except that the initialization transistor 1370 may be connected between a third node N3 and an initialization voltage VINIT that is different from first and second power supply voltages ELVDD and ELVSS.

The initialization transistor 1370 may transfer the initialization voltage VINIT applied through an initialization voltage line to the third node N3 in response to an initialization control signal GI. The initialization transistor 1370 may be implemented with a transistor T17 having a gate to which the initialization control signal GI is applied, a first terminal connected to the initialization voltage line, and a second terminal connected to the third node N3.

In some example embodiments, as illustrated in FIG. 21, the initialization voltage VINIT applied through the initialization voltage line may have a first voltage level during an initialization period TINIT, and may have a second voltage level different from the first voltage level during an anode initialization period TINIT2 after a data writing period TWRITE.

For example, during the initialization period TINIT, the first power supply voltage ELVDD may have a second ELVDD voltage level (e.g., about 6 V), and the initialization voltage VINIT may have the first voltage level (e.g., about 6 V) that is substantially the same as the second ELVDD voltage level. Accordingly, during the initialization period TINIT, the driving transistor 1330 may be initialized to an off-bias state where a gate-source voltage of about 0 V and a drain-source voltage of about 0 V are applied.

During the anode initialization period TINIT2 after the data writing period TWRITE, an anode of the organic light emitting diode OLED may be reinitialized by the initialization voltage VINIT having the second voltage level. For example, the second voltage level of the initialization voltage VINIT may be substantially the same as a second ELVSS voltage level (e.g., about 13 V) of the second power supply voltage ELVSS. Because the anode of the organic light emitting diode OLED is reinitialized during the anode initialization period TINIT2 after the data writing period TWRITE, luminance uniformity of pixels included in the organic light emitting diode display device may be further improved.

Figure 22:
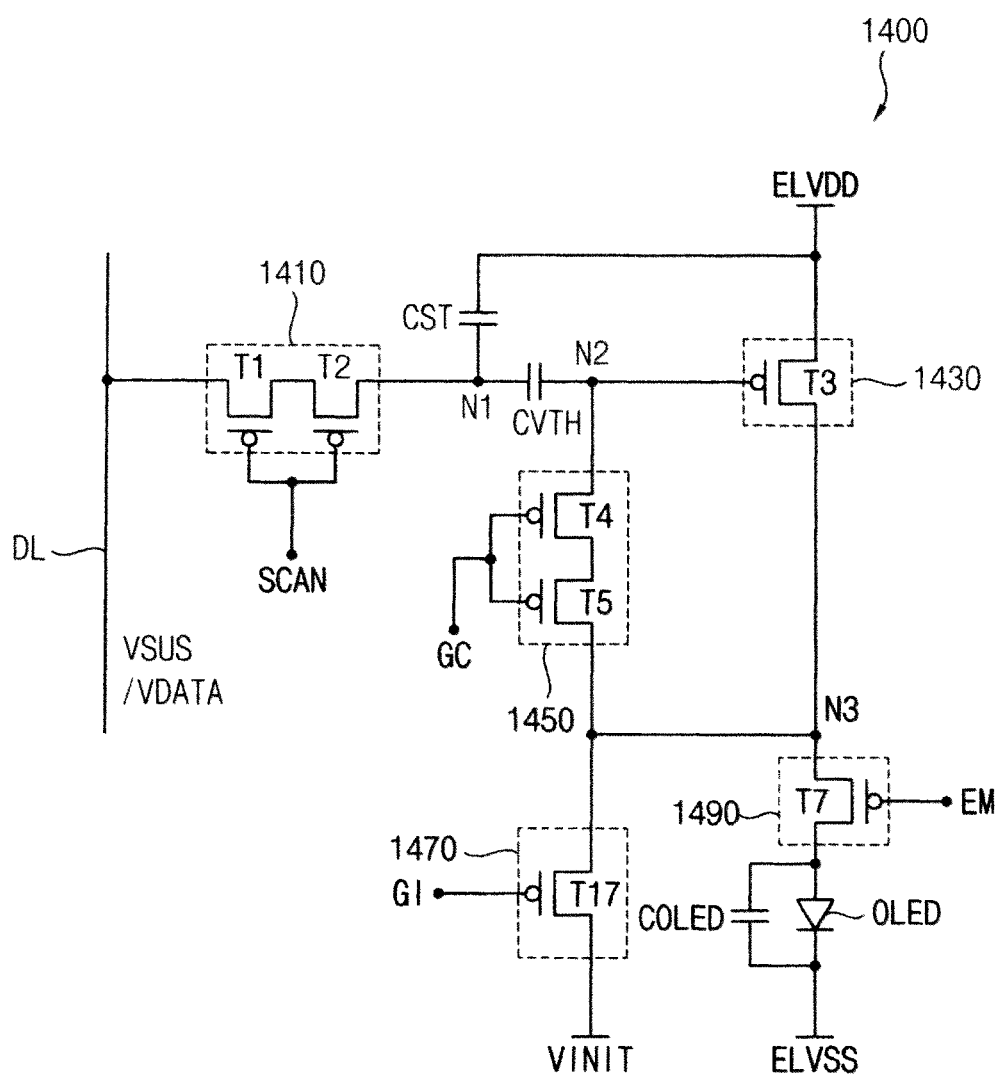
FIG. 22 is a circuit diagram illustrating a pixel of an organic light emitting diode display device according to example embodiments.

FIG. 22 is a circuit diagram illustrating a pixel of an organic light emitting diode display device according to example embodiments.

Referring to FIG. 22, a pixel 1400 of an organic light emitting diode display device may include a scan transistor 1410, a storage capacitor CST, a compensation transistor CVTH, a driving transistor 1430, a compensation transistor 1450, an organic light emitting diode OLED, an initialization transistor 1470, and an emission control transistor 1490. The pixel 1400 of FIG. 22 may have a similar configuration to a pixel 1300 of FIG. 20, except that the pixel 1400 may further include the emission control transistor 1490.

Figure 23:
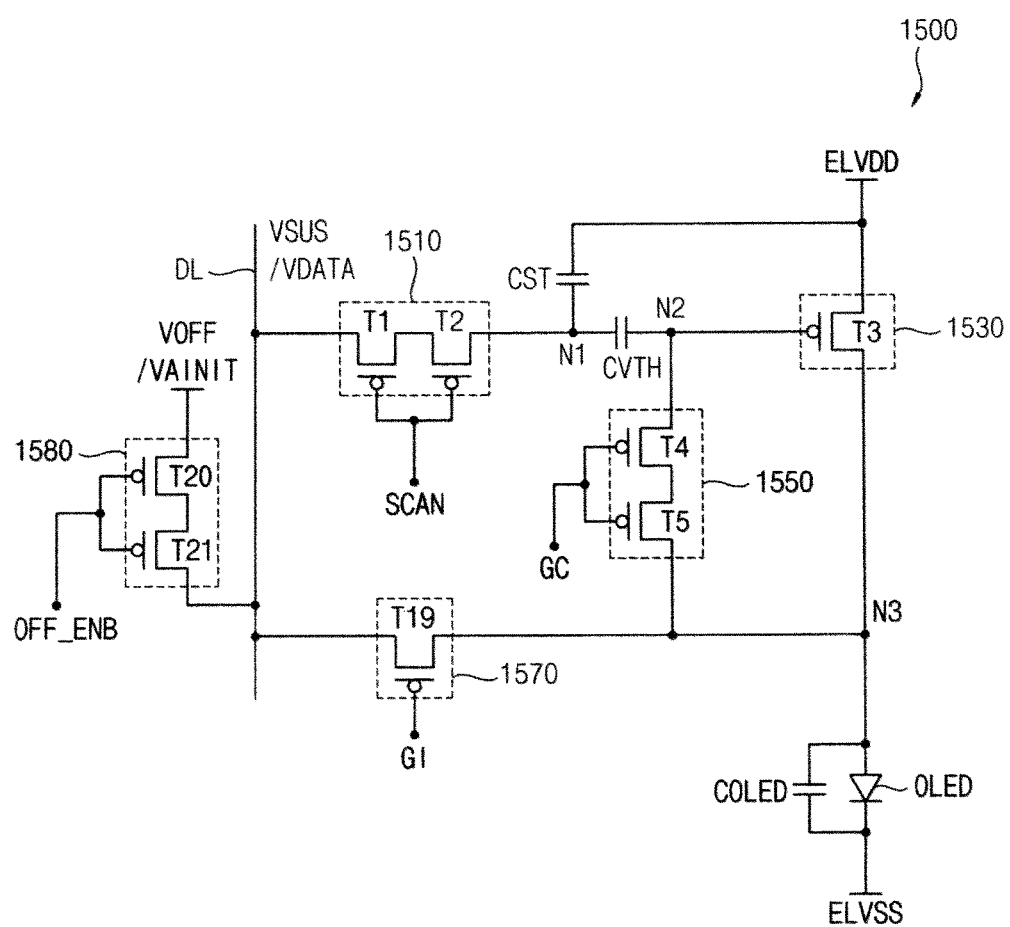
FIG. 23 is a circuit diagram illustrating a pixel of an organic light emitting diode display device according to example embodiments.
Figure 24:
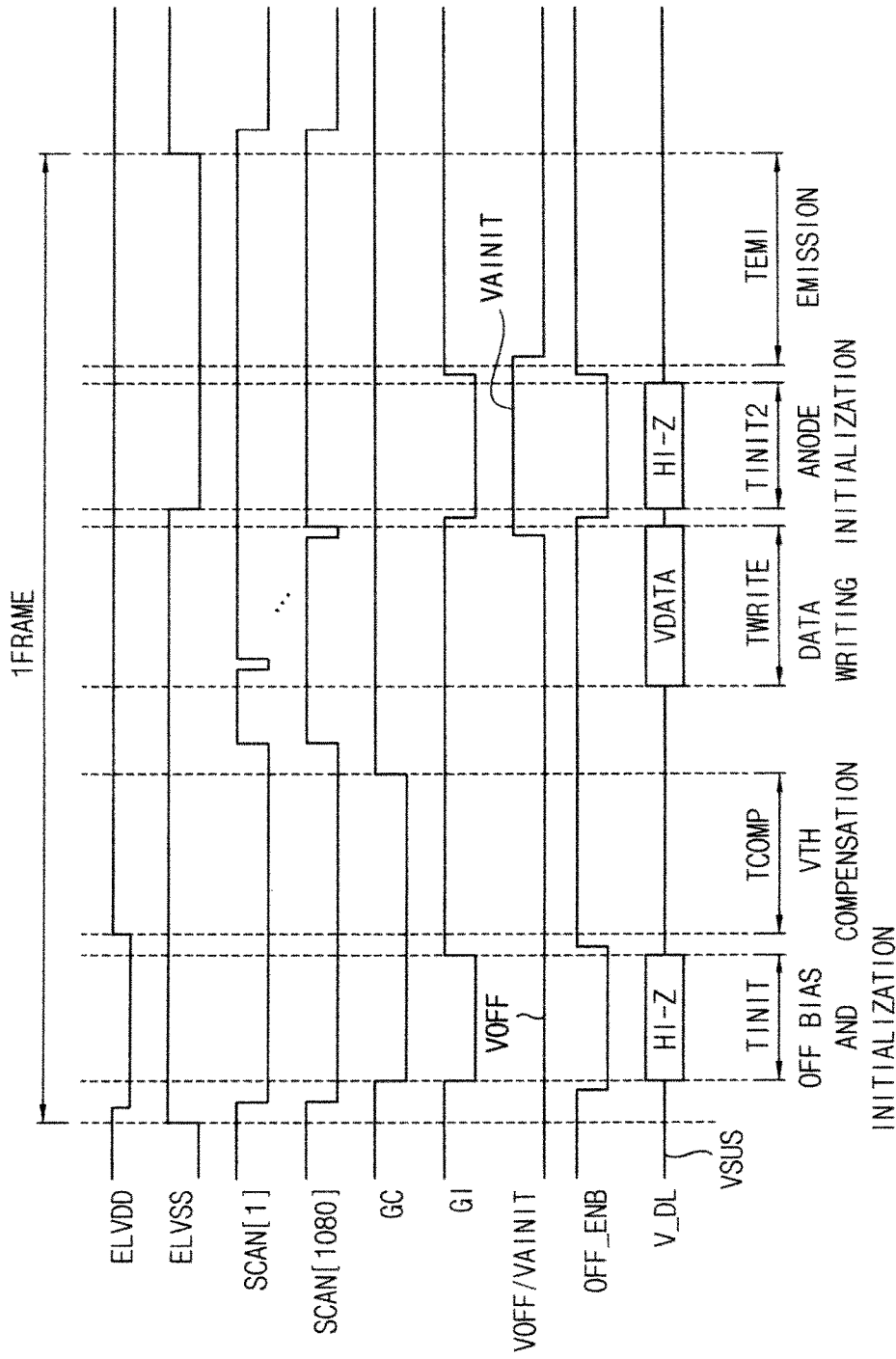
FIG. 24 is a timing diagram for illustrating an operation of a pixel of an organic light emitting diode display device illustrated in FIG. 23.

FIG. 23 is a circuit diagram illustrating a pixel of an organic light emitting diode display device according to example embodiments, and FIG. 24 is a timing diagram for illustrating an operation of a pixel of an organic light emitting diode display device illustrated in FIG. 23.

Referring to FIG. 23, a pixel 1500 of an organic light emitting diode display device may include a scan transistor 1510, a storage capacitor CST, a compensation transistor CVTH, a driving transistor 1530, a compensation transistor 1550, an organic light emitting diode OLED, and an initialization transistor 1570. The pixel 1500 of FIG. 23 may have a similar configuration to a pixel 100 of FIG. 1, except that the initialization transistor 1570 may be connected between a data line DL and a third node N3.

In the pixel 1500 of the organic light emitting diode display device, an initialization voltage VOFF/VAINIT may be applied through the data line. The organic light emitting diode display device may further include, per data line DL, an initialization voltage applying transistor 1580 to selectively apply the initialization voltage VOFF/VAINIT to each of the data lines DL in response to an initialization enable signal OFF_ENB. In some example embodiments, the initialization voltage applying transistor 1580 may have a dual gate structure including two transistors T20 and T21.

The initialization transistor 1570 may transfer the initialization voltage VOFF/VAINIT applied through the data line DL to the third node N3 in response to an initialization control signal GI. The initialization transistor 1570 may be implemented with a transistor T19 having a gate to which the initialization control signal GI is applied, a first terminal connected to the data line DL, and a second terminal connected to the third node N3.

In some example embodiments, as illustrated in FIG. 24, the initialization enable signal OFF_ENB may have a low level during an initialization period TINIT and during an anode initialization period TINIT2 after a data writing period TWRITE, and the initialization voltage applying transistor 1580 may be turned on in response to the initialization enable signal OFF_ENB during the initialization period TINIT and during the anode initialization period TINIT2.

The initialization voltage VOFF/VAINIT applied through the data line DL may be an off voltage VOFF having a voltage level that is substantially the same as a second ELVDD voltage level (e.g., about 6 V) of a first power supply voltage ELVDD during the initialization period TINIT, and may be an anode initialization voltage VAINIT having a voltage level that is substantially the same as a second ELVSS voltage level (e.g., about 13 V) of a second power supply voltage ELVSS during the anode initialization period TINIT2.

During the initialization period TINIT and during the anode initialization period TINIT2, any voltage V_DL may not be provided by a data driver to the data line DL, and the data line DL may be in a high impedance (HI-Z) state with respect to the data driver. Accordingly, during the initialization period TINIT, the driving transistor 1530 may be initialized to an off-bias state where a gate-source voltage of about 0 V and a drain-source voltage of about 0 V are applied. Further, during the anode initialization period TINIT2 after the data writing period TWRITE, an anode of the organic light emitting diode OLED may be reinitialized by the anode initialization voltage VAINIT, and thus luminance uniformity of pixels included in the organic light emitting diode display device may be further improved.

Figure 25:
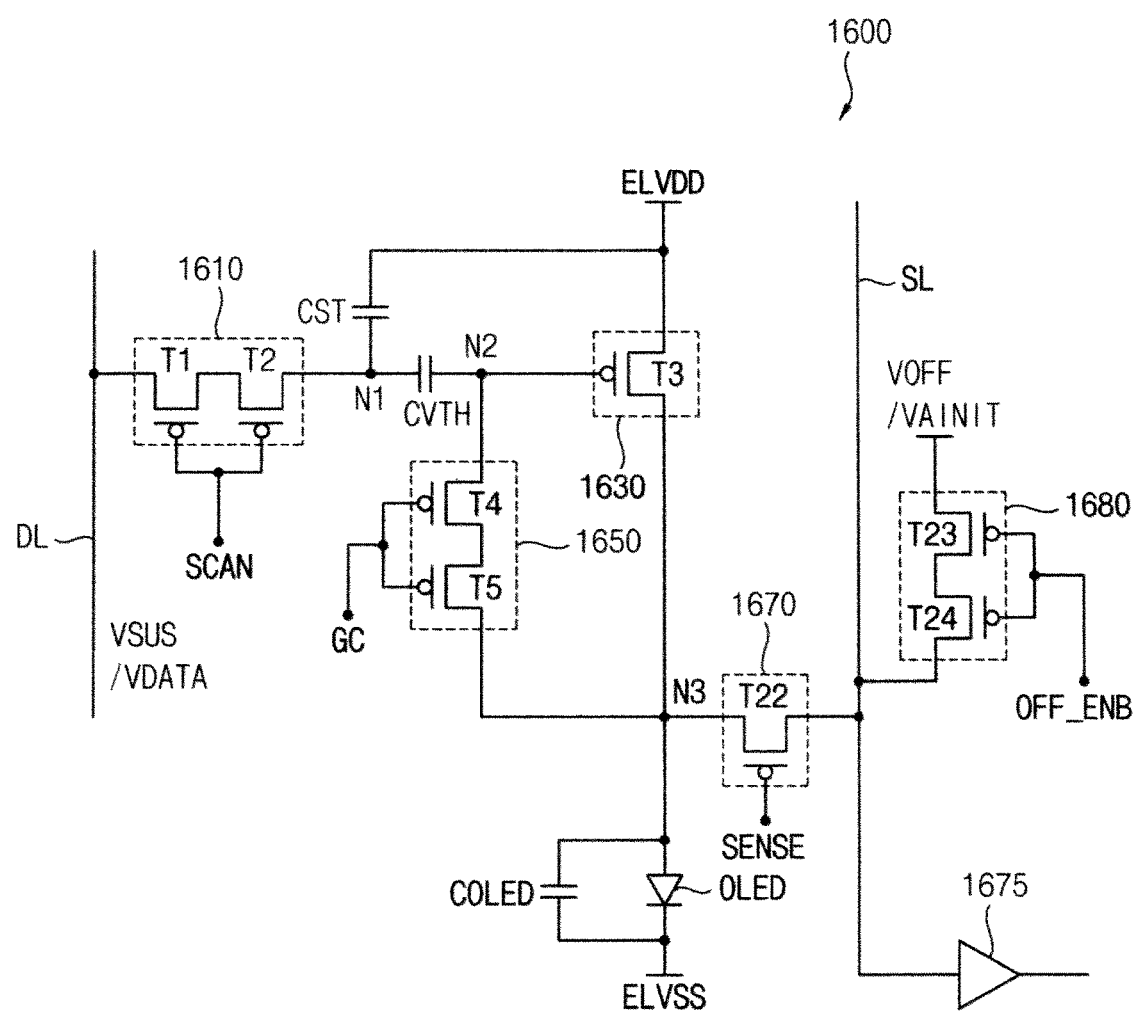
FIG. 25 is a circuit diagram illustrating a pixel of an organic light emitting diode display device according to example embodiments.

FIG. 25 is a circuit diagram illustrating a pixel of an organic light emitting diode display device according to example embodiments.

Referring to FIG. 25, a pixel 1600 of an organic light emitting diode display device may include a scan transistor 1610, a storage capacitor CST, a compensation transistor CVTH, a driving transistor 1630, a compensation transistor 1650, an organic light emitting diode OLED, and a sensing transistor 1670 connected between a third node N3 and a sensing line SL. The pixel 1600 of FIG. 25 may have a similar configuration to a pixel 100 of FIG. 1, except that the sensing transistor 1670 may be used as an initialization transistor.

The sensing transistor 1670 may selectively connect the third node N3 to the sensing line SL in response to a sensing signal SENSE. For example, the sensing transistor 1670 may be implemented with a transistor T22 having a gate to which the sensing signal SENSE is applied, a first terminal connected to the sensing line SL, and a second terminal connected to the third node N3. During a sensing period, the sensing transistor 1670 may connect the third node N3 to the sensing line SL in response to the sensing signal SENSE such that a voltage or a current representing a characteristic of the driving transistor 1630 and/or the organic light emitting diode OLED may be measured through the sensing line SL and a sensing circuit 1675 (e.g., an analog-to-digital converter).

In the pixel 1600 of the organic light emitting diode display device, an initialization voltage VOFF/VAINIT may be applied through the sensing line SL and the sensing transistor 1670. The organic light emitting diode display device may further include, per sensing line SL, an initialization voltage applying transistor 1680 to selectively apply the initialization voltage VOFF/VAINIT to respective sensing lines SL in response to an initialization enable signal OFF_ENB. In some example embodiments, the initialization voltage applying transistor 1680 may have a dual gate structure including two transistors T23 and T24. Initialization operations of the pixel 1600 of FIG. 25 may be similar to initialization operations of a pixel 1500 of FIGS. 23 and 24, except that the sensing line SL may be used instead of the data line DL.

Figure 26:
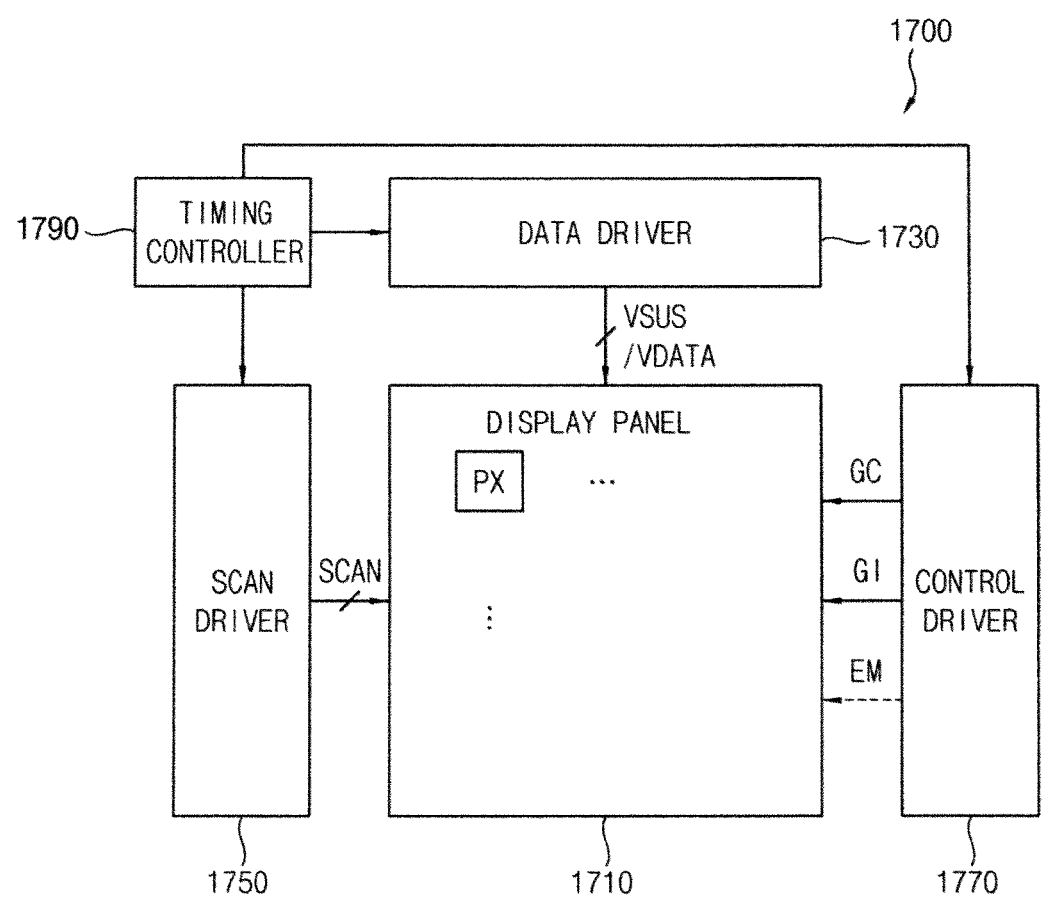
FIG. 26 is a block diagram illustrating an organic light emitting diode display device according to example embodiments.

FIG. 26 is a block diagram illustrating an organic light emitting diode display device according to example embodiments.

Referring to FIG. 26, an organic light emitting diode display device 1700 may include a display panel 1710 including a plurality of pixels PX, a data driver 1730 providing a sustain voltage VSUS or a data voltage VDATA to the pixels PX, a scan driver 1750 providing a scan signal SCAN to the pixel PX, a control driver 1770 providing a compensation control signal GC, an initialization control signal GI, and/or an emission control signal EM to the pixels PX, and a timing controller 1790 controlling the data driver 1730, the scan driver 1750, and the control driver 1770.

In the organic light emitting diode display device 1700, a driving transistor of each of the pixels PX may be initialized to an off-bias state, and thus stress applied to the driving transistor may be reduced (e.g., minimized). Further, in the organic light emitting diode display device 1700, before a threshold voltage compensation operation for the driving transistor is initiated, a voltage of a gate of the driving transistor may be initialized to a substantially fixed voltage, and thus an initial voltage level of a threshold voltage compensation voltage provided to a compensation capacitor may be substantially fixed or constant over time. Accordingly, the threshold voltage of the driving transistor may be accurately compensated even after the lapse of time. In addition, in the organic light emitting diode display device 1700, a voltage of an anode of an organic light emitting diode may be maintained to be substantially constant before the organic light emitting diode emits light, and thus luminance uniformity of the organic light emitting diode display device 1700 may be improved.

Figure 27:
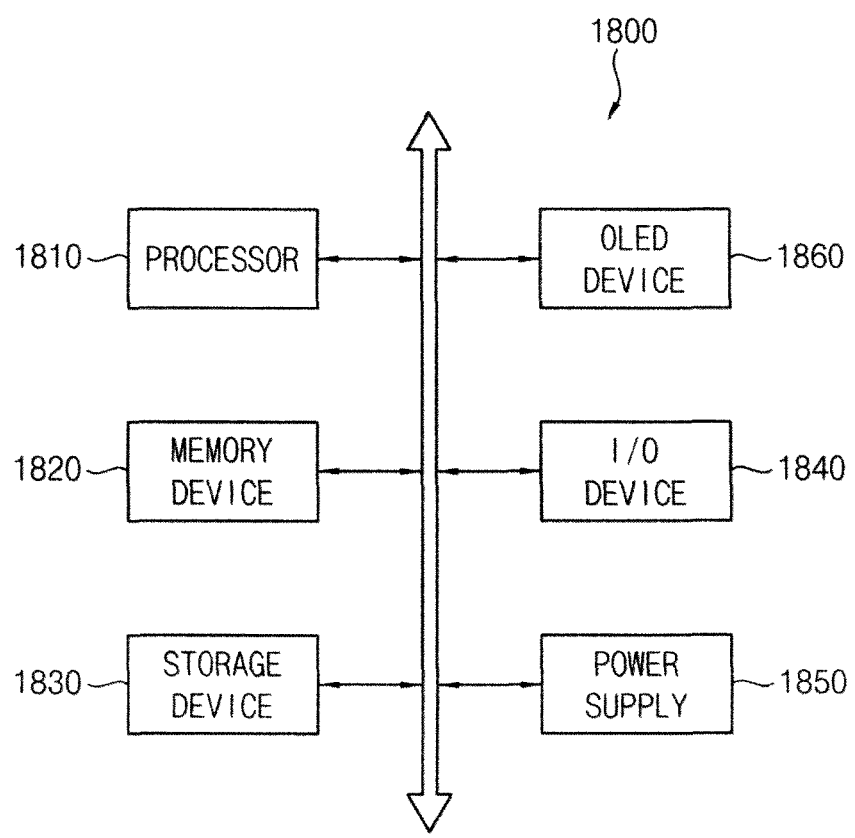
FIG. 27 is a block diagram illustrating an electronic device including an organic light emitting diode display device according to example embodiments.

FIG. 27 is a block diagram illustrating an electronic device including an organic light emitting diode display device according to example embodiments.

Referring to FIG. 27, an electronic device 1800 may include a processor 1810, a memory device 1820, a storage device 1830, an input/output (I/O) device 1840, a power supply 1850, and an organic light emitting diode display device 1860. The electronic device 1800 may further include a plurality of ports for communicating with other electric devices (e.g., a video card, a sound card, a memory card, a universal serial bus (USB) device, other suitable electric devices, etc.).

The processor 1810 may perform various computing functions. The processor 1810 may be a microprocessor, a central processing unit (CPU), an application processor (AP), etc. The processor 1810 may be coupled to other suitable components via an address bus, a control bus, a data bus, etc. Further, in some example embodiments, the processor 1810 may be further coupled to an extended bus such as a peripheral component interconnection (PCI) bus.

The memory device 1820 may store data for operations of the electronic device 1800. For example, the memory device 1820 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1830 may be a solid state drive device, a hard disk drive device, a CD-ROM device, etc. The I/O device 1840 may be an input device such as a keyboard, a keypad, a mouse, a touch screen, etc., and an output device such as a printer, a speaker, etc. The power supply 1850 may supply power for operations of the electronic device 1800.

In the organic light emitting diode display device 1860, a driving transistor of each of the pixels PX may be initialized to an off-bias state, and thus stress applied to the driving transistor may be reduced (e.g., minimized). Further, in the organic light emitting diode display device 1860, before a threshold voltage compensation operation for the driving transistor is initiated, a voltage of a gate of the driving transistor may be initialized to a substantially fixed voltage, and thus an initial voltage level of a threshold voltage compensation voltage provided to a compensation capacitor may be substantially fixed or constant over time. Accordingly, the threshold voltage of the driving transistor may be accurately compensated even after the lapse of time. In addition, in the organic light emitting diode display device 1860, a voltage of an anode of an organic light emitting diode may be maintained to be substantially constant before the organic light emitting diode emits light, and thus luminance uniformity of the organic light emitting diode display device 1860 may be improved.

The present inventive concept may be applied to any electronic device 1800 that includes the organic light emitting diode display device 1860. For example, the present inventive concept may be applied to a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

A relevant device or component (or relevant devices or components) according to embodiments of the present invention described herein may be implemented utilizing any suitable hardware, firmware (e.g., an application-specific integrated circuit), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A pixel of an organic light emitting diode display device, the pixel comprising:
    a scan transistor configured to connect a data line to a first node in response to a scan signal;
    a storage capacitor connected between the first node and a first power supply voltage;
    a compensation capacitor connected between the first node and a second node;
    a driving transistor comprising a gate connected to the second node, a source connected to the first power supply voltage, and a drain connected to a third node;
    a compensation transistor comprising a first compensation transistor and a second compensation transistor, and configured to connect the second node to the third node in response to a compensation control signal;
    an organic light emitting diode connected between the third node and a second power supply voltage; and
    an initialization transistor configured to transfer an initialization voltage in response to an initialization control signal, the initialization transistor having a first terminal connected to the first power supply voltage, the first compensation transistor being connected between the second node and a second terminal of the initialization transistor, the second compensation transistor being connected between the second terminal of the initialization transistor and the third node, the compensation transistor and the initialization transistor being configured to be turned on in response to the compensation control signal and the initialization control signal, respectively, to transfer the initialization voltage to the second node and the third node during an initialization period.

2. The pixel of claim 1,
    wherein when the initialization voltage is transferred to the second node and the third node, by the compensation transistor and the initialization transistor, during the initialization period, the driving transistor is initialized to an off-bias state.

3. The pixel of claim 1,
wherein the initialization voltage is the first power supply voltage.

4. The pixel of claim 3,
wherein the initialization transistor further comprises:
a gate to which the initialization control signal is applied.

5. A pixel of an organic light emitting diode display device, comprising:
first and second transistors connected in series between a data line and a first node, the first and second transistors being turned on in response to a scan signal;
a first capacitor connected between the first node and a first power supply voltage;
a second capacitor connected between the first node and a second node;
a third transistor comprising:
a gate connected to the second node;
a first terminal connected to the first power supply voltage; and
a second terminal connected to a third node;
a fourth transistor connected between the second node and a fourth node and a fifth transistor connected between the fourth node and the third node, the fourth and fifth transistors being turned on in response to a compensation control signal;
a sixth transistor comprising:
a gate to which an initialization control signal is applied;
a first terminal connected to the first power supply voltage; and
a second terminal connected to the fourth node; and
an organic light emitting diode connected between the third node and a second power supply voltage.

6. An organic light emitting diode display device comprising a plurality of pixels, each of the pixels comprising:
a scan transistor configured to connect a data line to a first node in response to a scan signal;
a storage capacitor connected between the first node and a first power supply voltage;
a compensation capacitor connected between the first node and a second node;
a driving transistor comprising:
a gate connected to the second node;
a source connected to the first power supply voltage; and
a drain connected to a third node;
a compensation transistor comprising a first compensation transistor and a second compensation transistor, and configured to connect the second node to the third node in response to a compensation control signal;
an organic light emitting diode connected between the third node and a second power supply voltage; and
an initialization transistor configured to transfer an initialization voltage in response to an initialization control signal, the initialization transistor having a first terminal connected to the first power supply voltage, the first compensation transistor being connected between the second node and a second terminal of the initialization transistor, the second compensation transistor being connected between the second terminal of the initialization transistor and the third node, the compensation transistor and the initialization transistor being configured to be turned on, in response to the compensation control signal and the initialization control signal, respectively, to transfer the initialization voltage to the second node and the third node during an initialization period.

* * * * *